(12) United States Patent
Cheah et al.

(10) Patent No.: US 10,191,193 B2
(45) Date of Patent: Jan. 29, 2019

(54) NANO BI-MATERIAL ELECTROMAGNETIC SPECTRUM SHIFTER

(71) Applicant: Hong Kong Baptist University, Hong Kong (HK)

(72) Inventors: Kok Wai Cheah, Hong Kong (HK); Suet Ying Ching, Hong Kong (HK)

(73) Assignee: Hong Kong Baptist University, Hong Kong (HK)

( * ) Notice: Subject to any disclaimer, the term of this patent is extended or adjusted under 35 U.S.C. 154(b) by 214 days.

(21) Appl. No.: 15/281,087

(22) Filed: Sep. 30, 2016

(65) Prior Publication Data
US 2017/0090082 A1 Mar. 30, 2017

Related U.S. Application Data

(60) Provisional application No. 62/234,662, filed on Sep. 30, 2015.

(51) Int. Cl.
| | | |
|---|---|---|
| *G02B 5/22* | (2006.01) | |
| *G02B 1/14* | (2015.01) | |
| *C03C 17/09* | (2006.01) | |
| *C23C 14/18* | (2006.01) | |
| *C23C 14/20* | (2006.01) | |

(Continued)

(52) U.S. Cl.
CPC .............. *G02B 5/22* (2013.01); *C03C 17/007* (2013.01); *C03C 17/09* (2013.01); *C03C 17/36* (2013.01); *C03C 17/3605* (2013.01); *C03C 17/38* (2013.01); *C23C 14/18* (2013.01); *C23C 14/20* (2013.01); *G02B 1/14* (2015.01); *G02B 5/008* (2013.01); *G02B 5/0808* (2013.01); *C03C 2217/252* (2013.01); *C03C 2217/253* (2013.01); *C03C 2217/256* (2013.01); *C03C 2217/258* (2013.01); *C03C 2217/26* (2013.01); *C03C 2217/445* (2013.01); *C03C 2217/45* (2013.01); *C03C 2217/479* (2013.01); *C03C 2218/151* (2013.01)

(58) Field of Classification Search
CPC . G02B 5/22; G02B 5/20; G02B 5/201; G02B 5/206; G02B 5/207
USPC ................................ 359/722, 723, 885, 891
See application file for complete search history.

(56) References Cited

U.S. PATENT DOCUMENTS

2015/0285969 A1* 10/2015 Kim ....................... G02B 5/201
359/891

OTHER PUBLICATIONS

Gottmann et. al., "Pulsed laser deposition of alumina and zirconia thin films on polymes and glass as optical and protective coating", Surface and coating technology 116-119, 1189-1194.*

(Continued)

*Primary Examiner* — Robert E. Tallman
(74) *Attorney, Agent, or Firm* — Spruson & Ferguson (Hong Kong) Limited

(57) ABSTRACT

The present invention relates to a nano bi-material, electromagnetic spectrum shifter based on said nano bi-material and method to produce said electromagnetic spectrum shifter using said nano bi-material. In particular, the present invention provides nano bi-material based electromagnetic spectrum shifter, e.g. color filters, with a wide range of transmission and color tunability and methods to produce said color filters. The present invention has applications in color filtration and production of color filters; reflector and production of reflectors; and electromagnetic spectrum shifter and production of electromagnetic spectrum shifters.

20 Claims, 31 Drawing Sheets

(51) Int. Cl.
    *G02B 5/00*        (2006.01)
    *G02B 5/08*        (2006.01)
    *C03C 17/00*      (2006.01)
    *C03C 17/36*      (2006.01)
    *C03C 17/38*      (2006.01)

(56) References Cited

OTHER PUBLICATIONS

David et.al., "Theory of random nanoparticle layers in photovoltaic devices applied to self-aggregated metal samples", solar energy materials & solar cells, 109, 294-299.*

Sennett and Scott, "The Structure of Evaporated Metal Films and Their Optical Properties", Journal of the Optical Society of America, vol. 40, No. 4, pp. 203-211, Apr. 1950.

* cited by examiner

NANO BI-MATERIAL ELECTROMAGNETIC SPECTRUM SHIFTER

CROSS-REFERENCE TO RELATED APPLICATIONS

This application claims the benefit of U.S. Provisional Patent Application Ser. No. 62/234,662 filed Sep. 30, 2015; the disclosures of which are incorporated herein by reference in their entirety.

FIELD OF THE INVENTION

The present invention relates to a nano bi-material electromagnetic spectrum shifter based on said nano bi-material and method to produce such color filters using nano bi-material. Said nano bi-material comprises two materials, wherein at least one of said material is metal based. In particular, the present invention provides said nano bi-material based electromagnetic spectrum shifter with a wide range of transmission and color tunability and methods to produce such electromagnetic spectrum shifters.

BACKGROUND OF THE INVENTION

When light passes through a color filter, some color components are removed. This is known as color subtraction. For example, a magenta filter would remove the green color, leaving the blue and red colors to transmit. General color filters take advantages of the absorption of pigment and dye molecules (color gel/lighting gel/gel) (see examples in FIG. 1) or the reflection of multi-layer thin films (dichroic filters). The former needs thick substrate to produce desired color effect but then causes low transmission (typically <40%), while the latter requires precision multi-layer deposition that can be time consuming in fabrication. Examples of the current technologies are:
- Color gel (i.e. color filter/lighting gel/gel) → absorption+transmission
- Dichroic filter (i.e. thin-film filter/interference filter) → reflection+transmission
- Neutral density filter (i.e. ND filter) → reduce the intensity of overall spectrum.

By exploiting surface plasmon resonance (SPR), color subtraction can be achieved producing similar color effect and the corresponding fabrication process is relatively simple. Noble metal nanoparticles (NPs) have been shown to induce various colors depending on their shape, size, distribution and surrounding medium. The perceived color is generated from the absorption characteristics of the noble metal itself (intrinsic properties) and also the scattering arisen from the dimension and geometry of the NPs. However using single metal NP can only produce color tuning by varying its dimension. Hence, the tuning range is somewhat limited.

To overcome the shortcomings of the conventional noble metal NPs, a new material for color filter with a wider range of transmission and color tunability, and the related production method for the same are urgently needed.

SUMMARY OF THE INVENTION

It is an objective of the present invention is to produce a nano bi-material for electromagnetic spectrum shifter including color filters and reflectors to result in a wider transmission range and color tunability.

In accordance with a first aspect of the present invention, there is provided a nano bi-material for producing a nano bi-material based electromagnetic spectrum shifter. Said nano bi-material comprises two materials, wherein at least one of said materials is metal based. It is possible that both of said materials are metal based. In the present invention, when both of said materials are metal based, they are preferably two dissimilar (or different) metals. It is also possible that one of said material is metal based while the other is an inorganic compound.

In accordance with a second aspect of the present invention, there is provided a method to produce said electromagnetic spectrum shifter using said nano bi-material wherein at least one of said materials is metal based. It is possible that both of said materials are metal based. In the present invention, when both of said materials are metal based, they are preferably two dissimilar metals. It is also possible that one of said material is metal based while the other is an inorganic compound.

In accordance with a third aspect of the present invention, there is provided a tunable electromagnetic spectrum shifter comprising: at least two different nano particles deposited as at least one layer onto at least one surface of an one or more transparent, translucent, or reflective substrate; wherein electromagnetic spectrum shifting is achieved via plasmonic coupling between the different nano particles in the at least one layer of at least two different nano particles; wherein the different nano particles are in close proximity to each other on the at least one surface of an one or more transparent, translucent, or reflective substrate; and wherein relative positions of two nano particles in each pair of the different nano particles are in random three-dimensional direction in respect with other pairs such that the different nano particles in each of said at least one layer of at least two different nano particles are not arranged as one layer of one nano particles stacked on top of another layer of the other one nano particles.

In a first embodiment of the third aspect of the present invention there is provided a tunable electromagnetic spectrum shifter further comprising at least one transparent protective layer further deposited to protect said at least one layer of at least two different deposited nano particles.

In a second embodiment of the third aspect of the present invention there is provided a tunable electromagnetic spectrum shifter wherein thickness of any one of said at least one layer of at least two different nano particles is at least 1 nm and no more than 15 nm, or the thickness of any one of said at least one layer of at least two different nano particles is equal to or less than a critical thickness of any one of said at least two different deposited nano particles.

In a third embodiment of the third aspect of the present invention there is provided a tunable electromagnetic spectrum shifter wherein average nano particle size of any one of said at least two different nano particles is in a range of 10 nm to 60 nm in circular disc diameter.

In a fourth embodiment of the third aspect of the present invention there is provided a tunable electromagnetic spectrum shifter wherein the distance between the at least two different nano particles is at least 1 nm such that said at least two different nano practices are in close proximity to each other, or the distance between the at least two different nano particles is equal to or less than a critical thickness of any one of said at least two different nano particles.

In a fifth embodiment of the third aspect of the present invention there is provided a tunable electromagnetic spectrum shifter wherein the at least two different nano particles comprise one nano metal particles and at least one other different nano particles being sequentially deposited onto said at least one surface of the one or more transparent, translucent, or reflective substrate to form said at least one layer of the at least two different nano particles.

In a sixth embodiment of the third aspect of the present invention there is provided a tunable electromagnetic spectrum shifter wherein the one nano metal particles is composed of metals which are screened plasma frequency at near-ultraviolet region or visible spectral regions such that the resonance is tunable in the visible spectral region due to the red-shift phenomenon in the presence of said at least one other different nano particles which are brought to close proximity to the one nano metal particles, and have a relatively lower absorption in visible spectral region such that a relatively higher overall transmittance is resulted in said shifter.

In a seventh embodiment of the third aspect of the present invention there is provided a tunable electromagnetic spectrum shifter wherein the at least one other different nano particles is composed of materials comprising metal, metal oxide, metal carbonate, or inorganic compounds.

In an eighth embodiment of the third aspect of the present invention there is provided a tunable electromagnetic spectrum shifter wherein when said metal oxide, metal carbonate and inorganic compounds are optically transparent the deposition thickness of the at least one other different nano particles is more than 15 nm.

In a ninth embodiment of the third aspect of the present invention there is provided a tunable electromagnetic spectrum shifter wherein the at least one other different nano particles acts as a color modifier in said shifter.

In a tenth embodiment of the third aspect of the present invention there is provided a tunable electromagnetic spectrum shifter wherein transmission and/or color of said shifter is tunable by varying materials for any one or more of the at least two different nano particles and/or by varying the deposition thickness of any one or more of the at least two different nano particles.

In an eleventh embodiment of the third aspect of the present invention there is provided a tunable electromagnetic spectrum shifter wherein said transparent or translucent substrate comprises glass, quartz, fused silica, and sapphire, and wherein said substrate has a smooth and unmarked or non-textured surface.

In a twelfth embodiment of the third aspect of the present invention there is provided a tunable electromagnetic spectrum shifter wherein one of said at least two different nano particles is metal based while the other of said at least two different nano particles is either metal based or an inorganic compound.

In a thirteenth embodiment of the third aspect of the present invention there is provided a tunable electromagnetic spectrum shifter wherein said one of the at least two different nano particles is silver or aluminum nano particles while said the other of the at least two different nano particles comprises nano particles of chromium, aluminum, titanium, $MoO_3$, $Cs_2CO_3$ and LiF.

In a fourteenth embodiment of the third aspect of the present invention there is provided a tunable electromagnetic spectrum shifter wherein said transparent protective layer comprises alumina and poly(methyl methacrylate).

In a fifteenth embodiment of the third aspect of the present invention there is provided a tunable electromagnetic spectrum shifter wherein said electromagnetic spectrum shifter comprises a tunable color filtration apparatus and a reflector.

In accordance with a fourth aspect of the present invention, there is provided a process of making a tunable electromagnetic spectrum shifter comprising: depositing a first nano particles onto at least one surface of an one or more transparent, translucent, or reflective substrate via a first physical vapor deposition method; depositing at least one further nano particles which is different to the first nano particles onto said substrate or the first nano particles via the first physical vapor deposition method or a second physical vapor deposition method in order to form at least one layer of two different nano particles; depositing at least one transparent protective layer onto the surface of said at least one layer of two different nano particles via any one of the first and second physical vapor deposition methods physical vapor deposition method or a solution process or an adhesive process.

In a first embodiment of the fourth aspect of the present invention there is provided a process of making a tunable electromagnetic spectrum shifter wherein the first physical deposition method and the second physical deposition method comprising resistive thermal evaporation, electron beam evaporation, sputtering and ion plating; wherein the solution process is a spin coating process; and wherein the adhesive process is a physical process of attaching a transparent adhesive film.

In accordance with a fifth aspect of the present invention, there is provided a tunable electromagnetic spectrum filter comprising: at least two different nano particles deposited as at least one layer onto at least one surface of an one or more transparent or translucent substrate; wherein electromagnetic spectrum filtering is achieved via plasmonic coupling between the different nano particles in the at least one layer of at least two different nano particles; wherein the different nano particles are in close proximity to each other on the at least one surface of an one or more transparent or translucent substrate; and wherein relative positions of two nano particles in each pair of the different nano particles are in random three-dimensional direction in respect with other pairs such that the different nano particles in each of said at least one layer of at least two different nano particles are not arranged as one layer of one nano particles stacked on top of another layer of the other one nano particles.

In accordance with a sixth aspect of the present invention, there is provided a tunable electromagnetic spectrum reflector comprising: at least two different nano particles deposited as at least one layer onto at least one surface of an one or more reflective substrate; wherein electromagnetic spectrum filtering is achieved via plasmonic coupling between the different nano particles in the at least one layer of at least two different nano particles; wherein the different nano particles are in close proximity to each other on the at least one surface of an one or more reflective substrate; and wherein relative positions of two nano particles in each pair of the different nano particles are in random three-dimensional direction in respect with other pairs such that the different nano particles in each of said at least one layer of at least two different nano particles are not arranged as one layer of one nano particles stacked on top of another layer of the other one nano particles.

Those skilled in the art will appreciate that the invention described herein is susceptible to variations and modifications other than those specifically described.

The present invention includes all such variation and modifications. The present invention also includes all of the steps and features referred to or indicated in the specification, individually or collectively, and any and all combinations or any two or more of the steps or features.

Other aspects and advantages of the present invention will be apparent to those skilled in the art from a review of the ensuing description.

BRIEF DESCRIPTION OF THE DRAWINGS

The above and other objects and features of the present invention will become apparent from the following description of the invention, when taken in conjunction with the accompanying drawings, in which.

DETAILED DESCRIPTION OF THE INVENTION

The present invention is not to be limited in scope by any of the specific embodiments described herein. The following embodiments are presented for exemplification only.

Without wishing to be bound by theory, the inventors have discovered through their trials, experimentations and research that to accomplish the task of producing color filters as an example of electromagnetic spectrum shifter using nano bi-material and inventing said color filters using nano bi-material.

In one embodiment of the present invention. the following two parameters are the key features/solutions being provided: (i) dimension and/or number of metal nano particles (NPs) and (ii) plasmonic coupling of two dissimilar (or different) metal NPs to tune the color, leading to a rich range of color filter, e.g. violet, purple, blue, yellow, orange, pink, etc., hence, the color filters of the present invention have a wider range of transmission and color tunability. The dimension and number of metal NPs can be controlled by varying the deposition rate on the substrate during evaporation or sputtering, and/or by varying the deposition thickness of the metal NPs. This is known in the art as reported in the section entitled "(b) Rate of Evaporation" under column 1 and column 2 of page 207 of the reference Sennett and G. D. Scott, "The Structure of Evaporated Metal Films and Their Optical Properties", Journal of the Optical Society of America, 40, 203 (1950); the disclosure of which is incorporated herein by reference in its entirety.

The Physics Behind the Color Production of One Embodiment of the Present Invention 1: The plasmonic resonance of Ag can be shifted to a longer wavelength when its particle size is increased. For clarity, any increase in either the dimension or number of particles will lead to the shift of plasmonic resonance. The resulting shift moves the plasmonic resonance into the visible range giving the color effect (e.g. yellow/orange color). However the color stability can be affected by degradation of Ag, such as oxidation.

2: Another metal NP is deposited in close approximation, preferably 1-15 nm, to Ag NP as a second or any subsequent metal NP. This causes strong plasmonic coupling and the coupling shifts the resulting plasmonic resonance into the visible range. This allows tunability in transmission color through appropriate choice of the second metal NP.

Brief Summary of One Embodiment of the Present Invention

Figure 1:
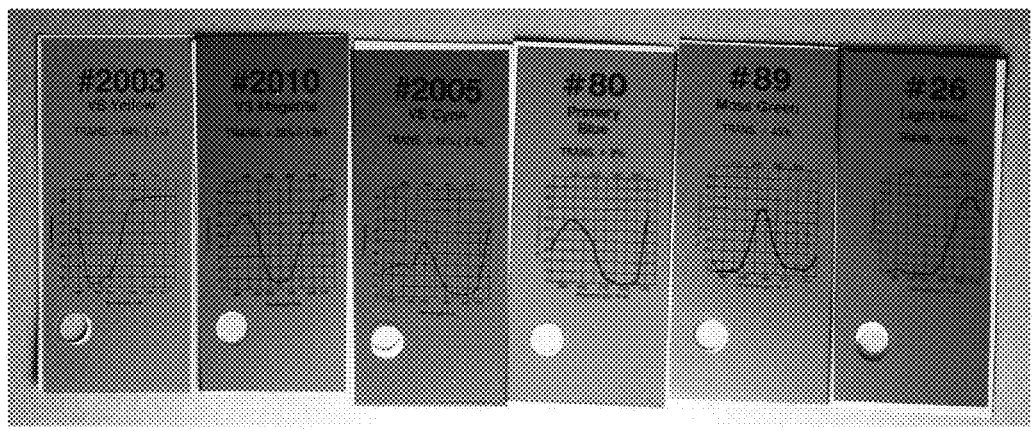
FIG. 1 shows examples of conventional color gel (i.e. color filter/lighting gel/gel) based on absorption of pigment and dye molecules and their corresponding transmission rate.
Figure 2:
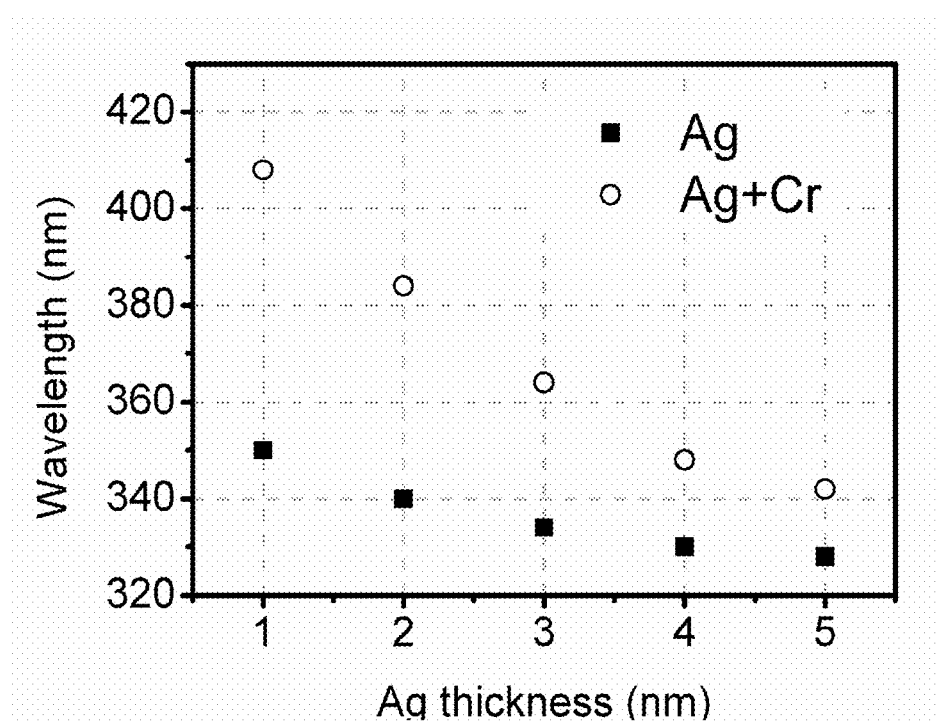
FIG. 2 shows the resonance dip from ellipsometry measurement (red-shift of resonance after adding chromium (Cr) NPs to silver (Ag) NPs).
Figure 3A:
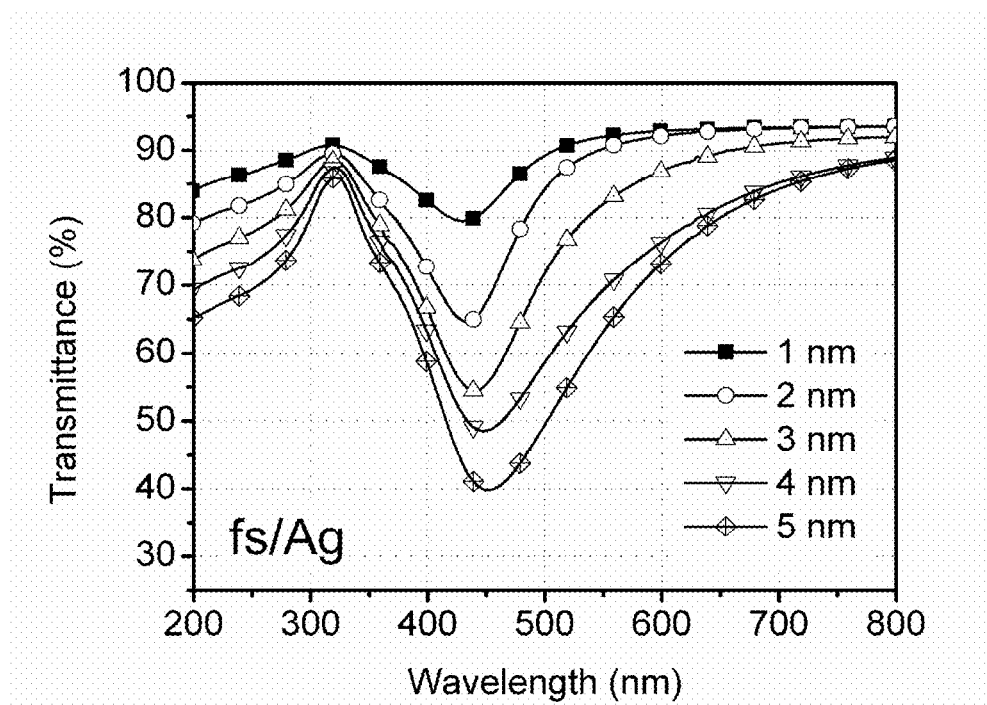
FIG. 3A shows the difference in transmittance of only Ag NPs being coated at various deposition thicknesses on fused silica (fs).
Figure 3B:
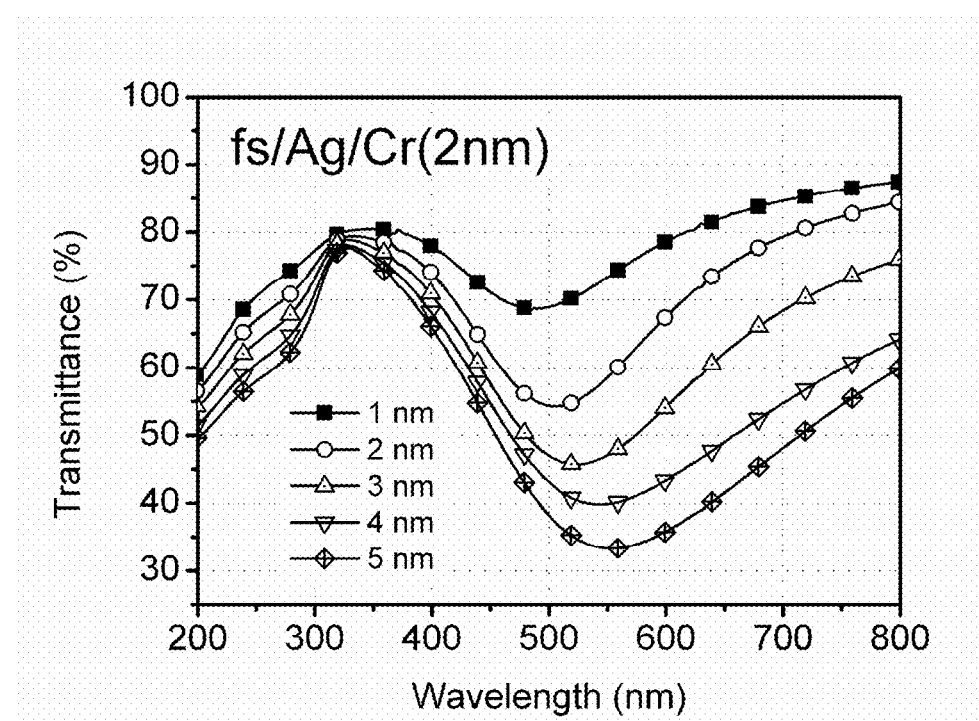
FIG. 3B shows the difference in transmittance of Ag+Cr NPs being coated at various deposition thicknesses of Ag and a fixed deposition thickness of Cr (i.e., 2 nm) on fused silica (fs).
Figure 4:
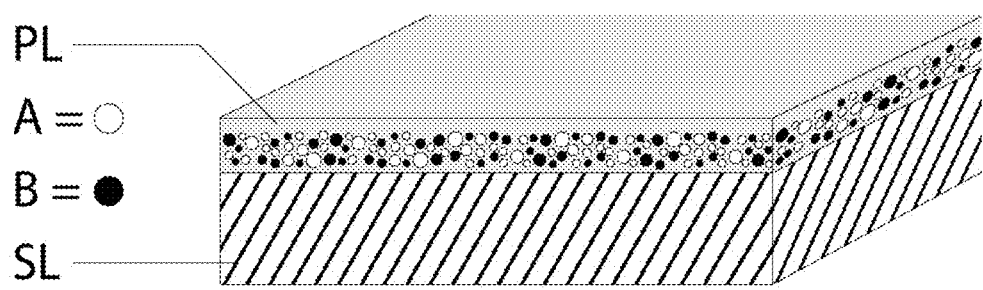
FIG. 4 is a schematic diagram showing a not-to-scale structure of an embodiment of the present nano bi-material based color filter: SL demarks a substrate layer; A demarks Metal A particles, B demarks Metal B particles and PL demarks a protection layer.

1) Tuning of the resonance wavelength through adjusting the dimension of metal NP, an example is Ag NP. Ideally, the resonance wavelength should be in UV to blue range because the shift in resonance wavelength is towards a longer wavelength.
2) Two dissimilar metals in nano-scale are provided which are responsible for different color production. This is done through plasmonic coupling between the two metal NPs which are in close proximity, preferably 1-15 nm apart.
3) To produce the color filter based on the two metal NPs in (2), transparent or translucent substrate (e.g. glass, quartz, fused silica, sapphire) is used as substrate in which the nano-metals are deposited thereon. To produce a reflector based on the two metal NPs in (2), however, reflective substrate (e.g. aluminum, silver, gold, chrome, silicon and white surface) is used as the substrate in which the nano-metals are deposited thereon. The deposited nano-metals' thickness is in a preferred range of 1-15 nm and with an average particle size having a circular disc diameter of 10-60 nm. The two metal NPs need to be in nano particle form after deposition on the substrate. The nano particles of the two metal NPs must also be thoroughly mixed and randomly distributed. That is, the relative positions of the two nano particles in each pair of dissimilar nano particles of the two metal NPs are in random three-dimensional direction in respect with the other pairs such that the two metal NPs are not arranged as stacked on top of each other. The separation distance between each pair of dissimilar nano particles of the two metal NPs cannot be too large on the deposition surface of the substrate because the two metal NPs have plasmonic coupling when they are brought in close proximity to each other.
4) The nano-metals of the present invention can be prepared by physical vapor deposition methods. (e.g. resistive thermal evaporation, electron beam evaporation and sputtering). Such methods of deposition preferably require deposition onto a smooth and unmarked or non-textured surface.
5) Metal A (e.g. silver) should have plasma frequency between near-ultraviolet and blue regions.
6) The dimension and/or number of Metal A NPs should be able to induce a resonance (Surface Plasmon Resonance (SPR) effect) and/or scattering in the visible region, which gives the subtracted color(s).
7) Metal B (e.g. chromium, titanium, indium) acts like tuning the resonance or scattering wavelength in (5); causing a red-shift for the resulting resonance wavelength into the optical range. This shift is due to plasmonic coupling between Metals A and B. Please see example in FIG. 2.
8) The change in the dimension and/or the number of Metals A and B NPs can cause the resonance or scattering wavelength to shift.
9) Consequently, perceived color of the color filter can be tuned by using (6) and (7).
10) The specified thickness and dimension of the deposited NPs layer allow higher transmission (e.g. >80%). The transmission data is shown in FIG. 3A and FIG. 3B.
11) A protective layer can be added on the deposited nano-metals of Metals A and B subsequently after said deposition. The protective layer can be by means of transparent thin film (e.g. silicon dioxide, alumina) or transparent adhesive film. A not-to-scale illustration of such an embodiment of a nano bi-material based color filter is shown in FIG. 4.
12) In another embodiment of the present invention, Metal A is interchanged with Metal B, and vice-verse.
13) In yet a further embodiment of the present invention, the substrate whereon the nano particles are deposited is a reflective medium.

Benefits of Embodiment of the Present Invention

1) Tunable by two metal NPs according to their dimensions and/or numbers in nano-scale.
2) High transmission of >80%.

Fabrication Method: Physical Vapor Deposition

Figure 5A:
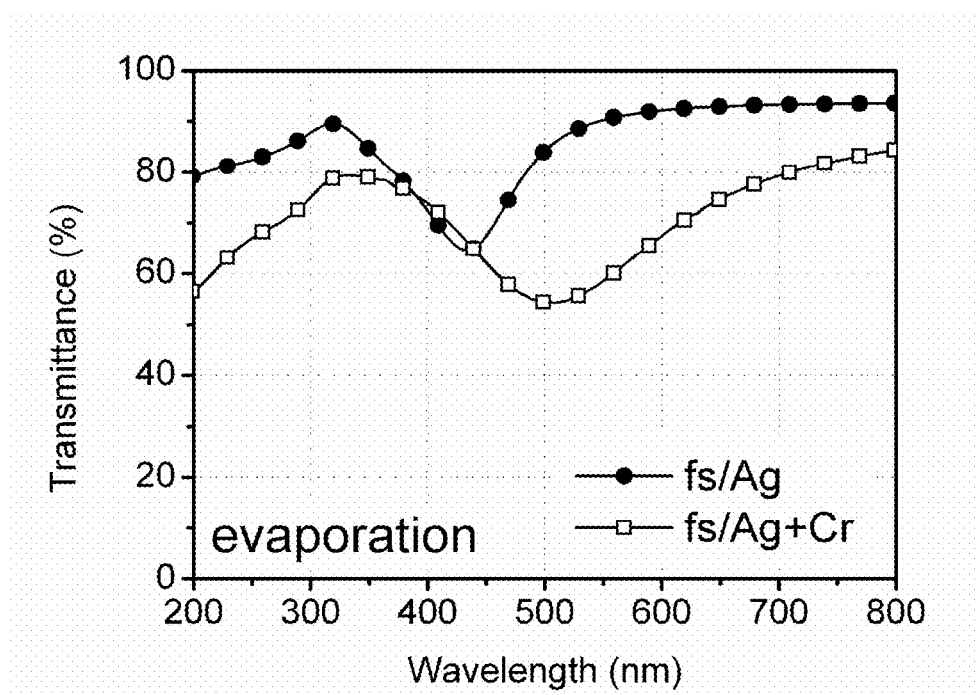
FIG. 5A shows Ag NPs and Ag+Cr NPs coatings on fused silica prepared by evaporation.
Figure 5B:
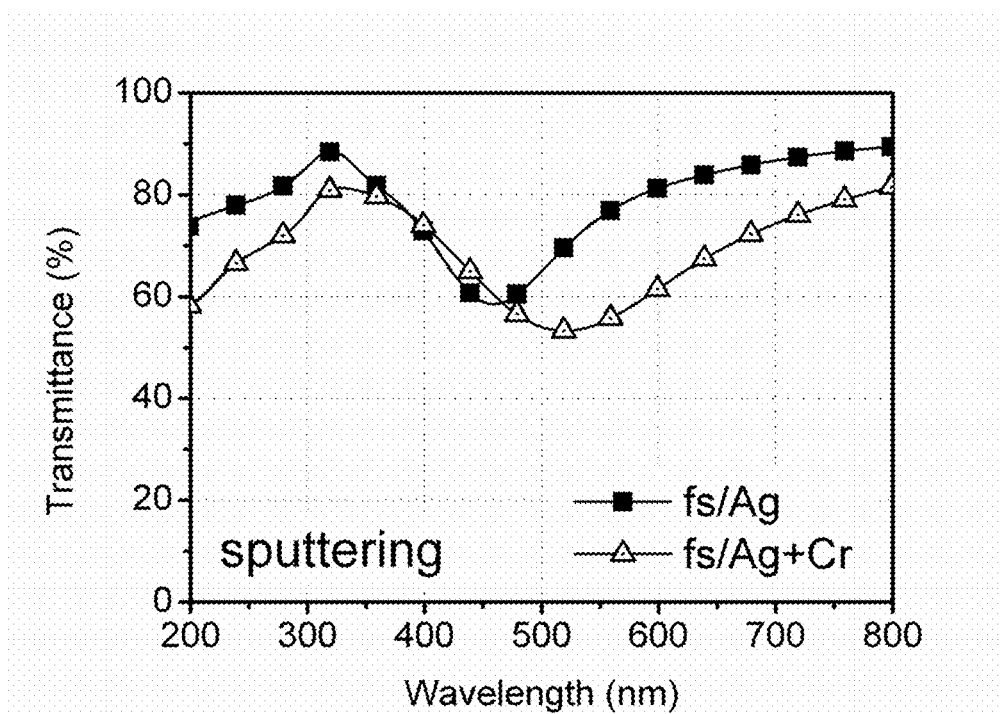
FIG. 5B shows Ag NPs and Ag+Cr NPs coatings on fused silica prepared by sputtering.

In FIG. 5A and FIG. 5B, from about 2 nm to about 4 nm are the deposition thicknesses of Ag, where any of these deposition thicknesses shall be equal to or smaller than 15 nm, which is the "critical thickness" under the deposition parameters of one embodiment of the present invention. This is further elaborated under the section on "Deposition thickness of primary material: equal to or below 15 nm". With an increasing deposition thickness or by adding second material, Ag resonance is red-shifted for samples prepared by evaporation (FIG. 5A) and sputtering (FIG. 5B), respectively, leading to a change in color. As it is also noted in the description of one embodiment of the present invention presented herein, the "critical thickness" can be greater than 15 nm for other deposition techniques and conditions (e.g. when the second material is optically transparent), wherein the "critical thickness" is the actual upper bound of the deposition thickness of the metal based materials used in the present invention. This "critical thickness" is also the actual upper bound of any of the two or more dissimilar metal-based materials deposited on the substrate for another embodiment of the present invention. It is well defined in the art that "critical thickness" is the deposition thickness for the deposited material particles begin to merge and for which, as it is well known, a rapid decrease in the electrical resistivity of the deposited film occurs.

The transmission spectra can resemble or deviate depending on the deposition method or system, particularly the vacuum conditions and vapor condensation conditions.

A Further Embodiment of the Present Invention—a Tunable Reflector

To produce a color reflector based on the two metal NPs using an embodiment as shown in FIG. 4, a reflective substrate (e.g. aluminum, silver, gold, chrome, silicon and white surface) is used as substrate (SL) in which the nano-metals are deposited thereon. The deposited nano-metals' thickness is in a preferred range of 1-15 nm and with an average particle size having a circular disc diameter of 10-60 nm. The two metal NPs need to be in nano particle form after deposition on the substrate. The nano particles of the two metal NPs must also be thoroughly mixed and randomly distributed. That is, the relative positions of the two nano particles in each pair of dissimilar nano particles of the two metal NPs are in random three-dimensional direction in respect with the other pairs such that the two metal NPs are not arranged as stacked on top of each other. The separation distance between each pair of dissimilar nano particles of the two metal NPs cannot be too large on the deposition surface of the substrate because the two metal NPs have plasmonic coupling when they are brought in close proximity to each other. In this embodiment, the selective reflection due to the plasmonic resonance can be measured by spectrophotometer with a reflection setup, ellipsometer, or other electromagnetic spectrum measurement instruments. In one embodiment of the present invention, there is provided measurements of some samples on silicon wafer to show the red-shift of the plasmonic resonance using ellipsometer (see FIG. 2).

Physical Vapor Deposition (PVD)

Generally in PVD (evaporation, sputtering, and ion plating), coatings are produced on solid surfaces by condensation of materials or compounds from vapor phase. Such solid surfaces are also preferably to be smooth, unmarked and non-textured. PVD comprises three steps:

1. Generation of vapors from the coating material either by evaporation and sublimation or by sputtering to form vaporized coating material.
2. The vaporized coating material travels through the reduced atmosphere from the source to a substrate. During their flight, collisions with residual gas molecules occur depending on vacuum conditions and source-to-substrate distance to form volatilized coating material. The volatilized coating material species can be activated or ionized by various means and the ions can be accelerated by electric fields.
3. Condensation of the volatilized coating material occurs on the substrate and finally a deposit of the coating material is formed by heterogeneous nucleation and film growth possibly during higher energy particle bombardment or under the action of impinging reactive or non-reactive gas species or both together.

With PVD technologies, depositions can be made over a wide substrate temperature range between heated glass of several hundred degrees down to liquid nitrogen cooled or even colder samples. Thus there is no problem in coating glass and plastics with PVD technologies when the material and substrate specific conditions are properly chosen.

Figure 6A:
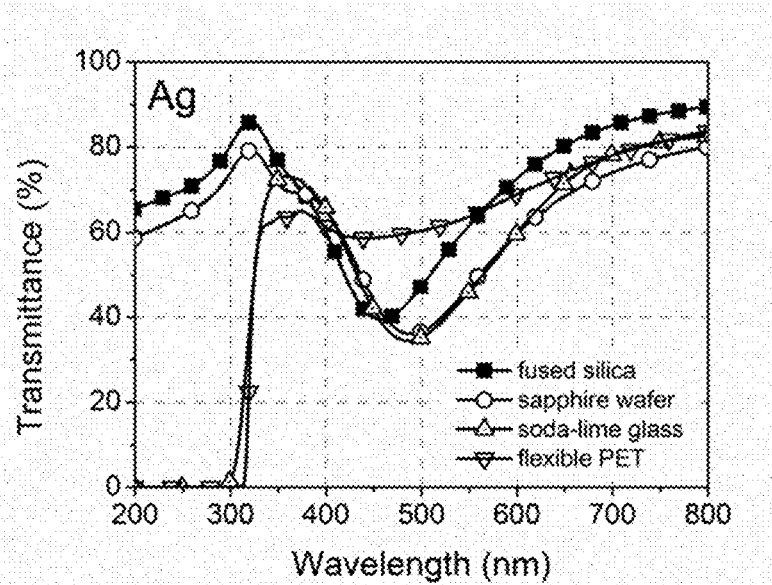
FIG. 6A shows embodiments of Ag NPs coating prepared on different substrates.
Figure 6B:
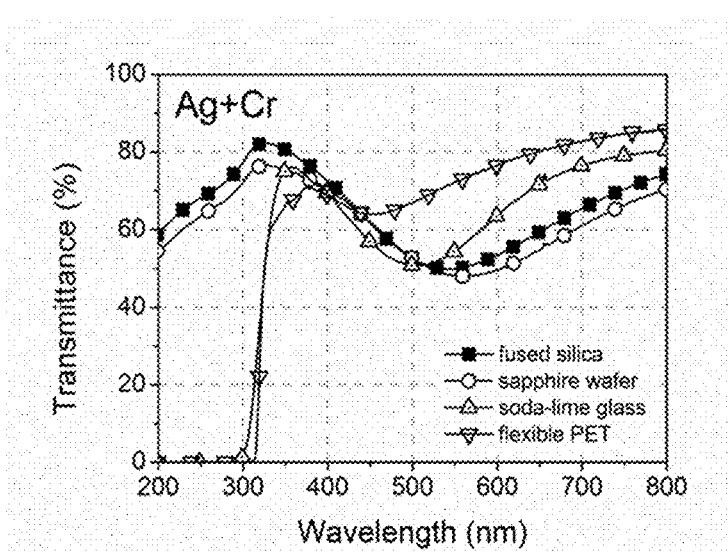
FIG. 6B shows embodiments of Ag+Cr NPs coating prepared on different substrates.
Figure 7A:
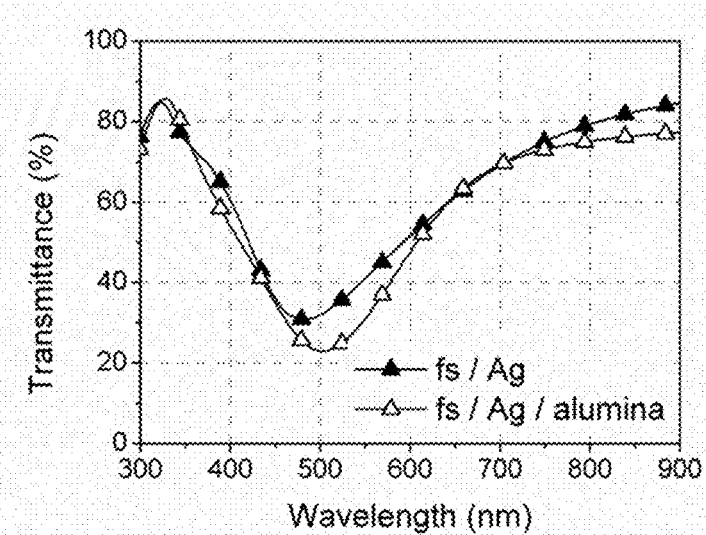
FIG. 7A shows embodiments of Ag NPs coating on fused silica (fs) only and on fused silica (fs) covered by alumina.
Figure 7B:
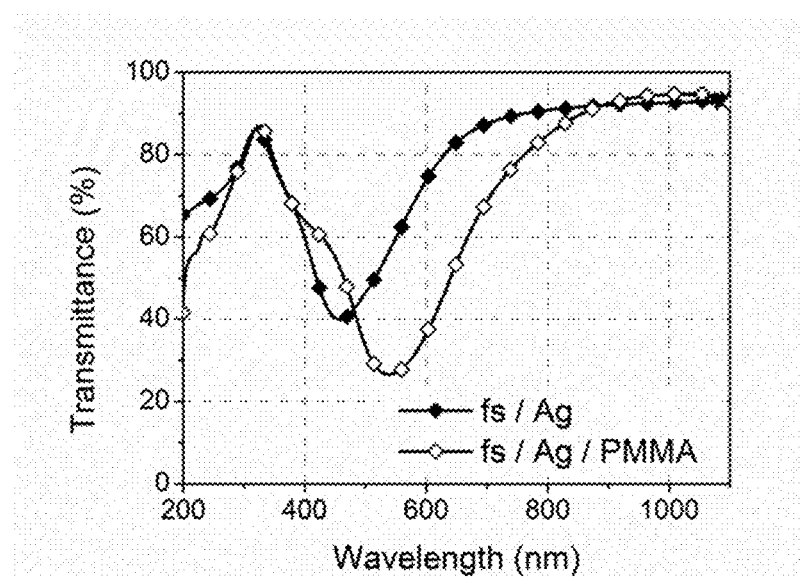
FIG. 7B shows embodiments of Ag NPs coating on fused silica (fs) only and on fused silica (fs) covered by PMMA.
Figure 7C:
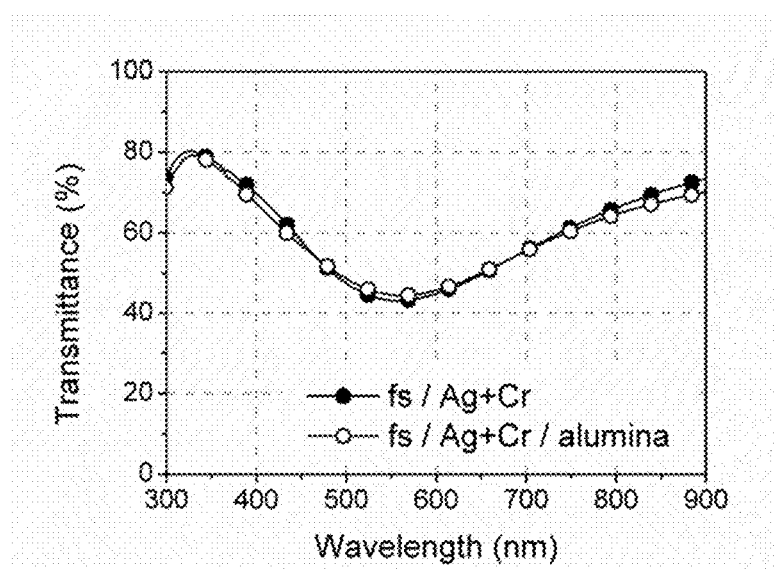
FIG. 7C shows embodiments of Ag+Cr NPs coating on fused silica (fs) only and on fused silica (fs) covered by alumina as a protective layer.
Figure 7D:
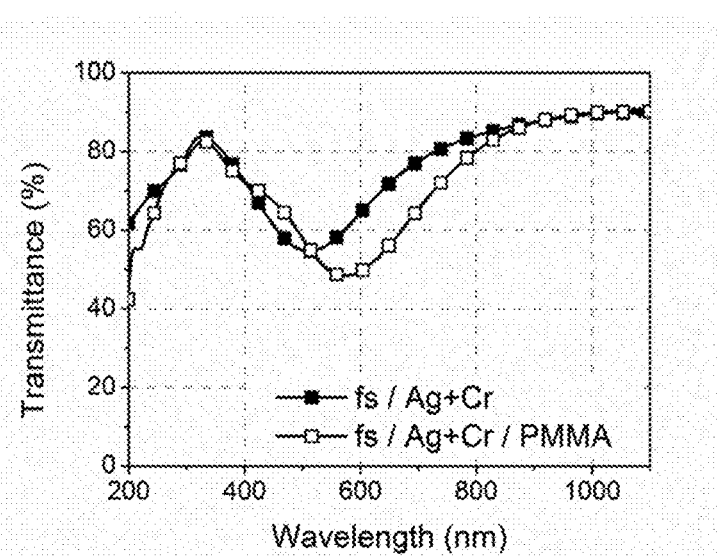
FIG. 7D shows embodiments of Ag+Cr NPs coating on fused silica (fs) only and on fused silica (fs) covered by PMMA as a protective layer.

Effect of Different Substrates on Ag Resonance:

As shown in FIG. 6A and FIG. 6B, when Ag NPs and Ag+Cr NPs are deposited on different substrates (e.g., transparent substrates such as: fused silica, quartz, sapphire, glass, flexible PET, etc.; reflective substrates such as: aluminum, silver, gold, chrome, silicon and white surface), Ag resonance varies (i.e. change in color) due to different refractive index of the substrates and their condensation condition.

From the results in FIGS. 6A and 6B, it is provided that any substrates with a solid surface supporting the deposits can be used although the Ag resonance or the color varies with the choice of substrate. Although fused silica is used as the substrate in some of the embodiments of the present invention, it is just for illustration purpose and not intended to be a preferred substrate in the present invention.

Protective Layer: Transparent Oxide or Plastic by PVD or Solution Process

FIG. 7A, FIG. 7B, FIG. 7C and FIG. 7D show different embodiments of the present invention by adding different materials on the Ag or Ag+Cr NPs coating as protective layer which may change Ag resonance (i.e. perceived color). While in one embodiment alumina is deposited by PVD (e.g., evaporation), in another embodiment poly(methyl methacrylate) (PMMA) is deposited by solution process (e.g., spin coating). PMMA is also known as acrylic or acrylic glass.

The protective layer can be deposited by either PVD or solution process (e.g. spin coating), provided that the material used as the protective layer does not chemically react with the coloring material(s) during the course of fabrication. Otherwise, Ag resonance may cease and discourage the coloration. It should be noted that the thickness of the protective layer can induce thin-film interference of light, causing the perceived color to change with the viewing angle. Therefore, the coloring material(s), e.g. the nano bi-material of the present invention, should not exceed the critical thickness as defined herein. This is necessary in keeping the nano particles of the coloring material(s) in particle form. Furthermore, solution process such as spin coating also prefers a smooth surface for a material to be coated thereon. Therefore, in the present invention, said surface is preferably unmarked or non-textured for maximum coating performance.

In the embodiment where a transparent adhesive film is used as the protective layer, an adhesive method which is by attaching said transparent adhesive film to the nano bi-material coating is performed, provided that the adhesive is not chemically reactive with the coloring materials during fabrication.

In other embodiment, the material of the protective layer which is not chemically reactive to the coloring materials, i.e., the nano bi-material of the present invention, may fill the gaps between the metal NPs in the nano bi-material coating such that the protective layer protects the nano bi-material coating from any chemical reaction with the external environment, e.g., oxidation of the nano bi-material coating being exposed to air or water.

Resistance to Heat Stable for Temperature Around or Below 150 Degree Celsius

Figure 8A:
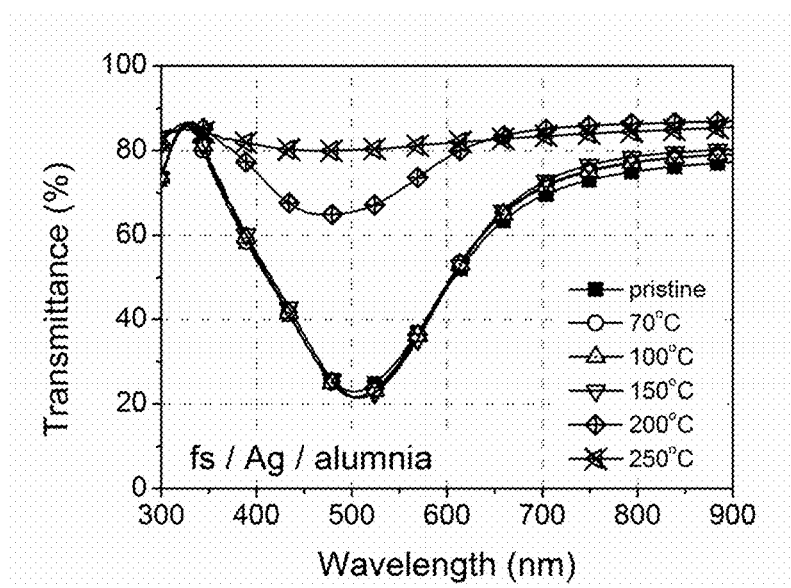
FIG. 8A shows embodiments of Ag NPs coating on fused silica (fs) covered by alumina as a protective layer and subjected to heat at various temperatures in air.
Figure 8B:
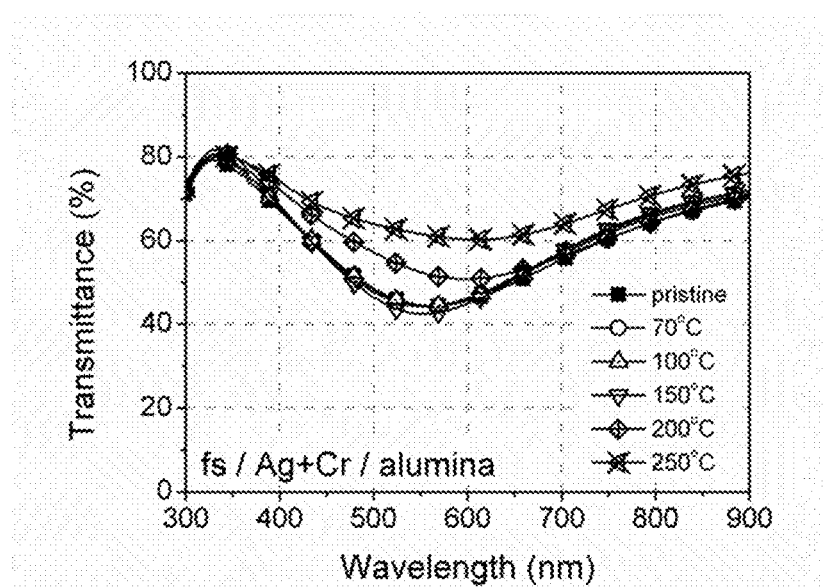
FIG. 8B shows embodiments of Ag+Cr NPs coating on fused silica (fs) covered by alumina as a protective layer and subjected to heat at various temperatures in air.

FIG. 8A and FIG. 8B respectively show embodiments of Ag NPs coating and Ag+Cr NP2 coating on fs as the substrate while being covered by alumina as the protective layer under exposure to various air temperatures. The results reveal that the color is changed dramatically at the temperature range from 150 to 250 degree Celsius. Such high temperature in air leads to oxidation of the coloring material(s), which causes decolorization. Besides that, higher temperature promotes the oxidation process.

Figure 9A:
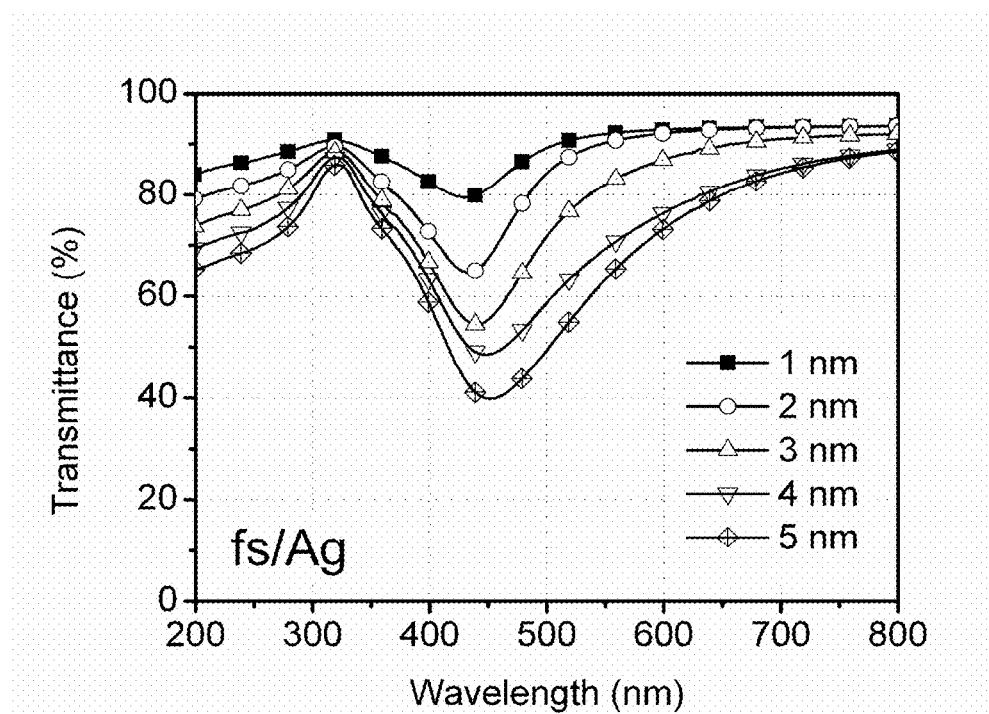
FIG. 9A shows embodiments of Ag NPs coating on fused silica (fs) with various Ag deposition thicknesses.
Figure 9B:
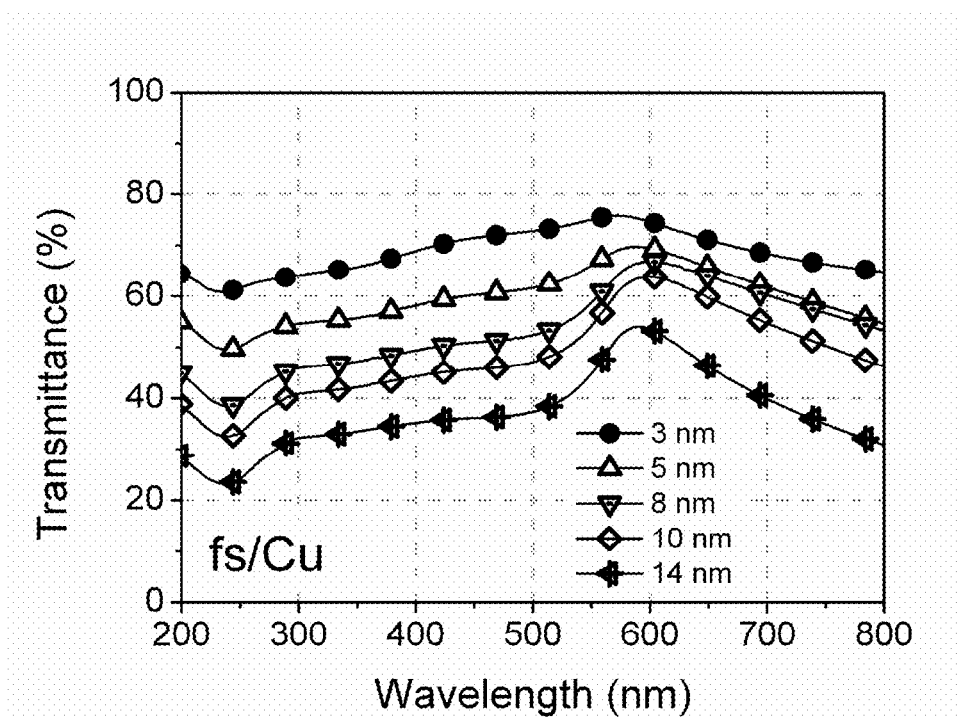
FIG. 9B shows embodiments of copper (Cu) NPs coating on fused silica (fs) with various Cu deposition thicknesses.
Figure 9C:
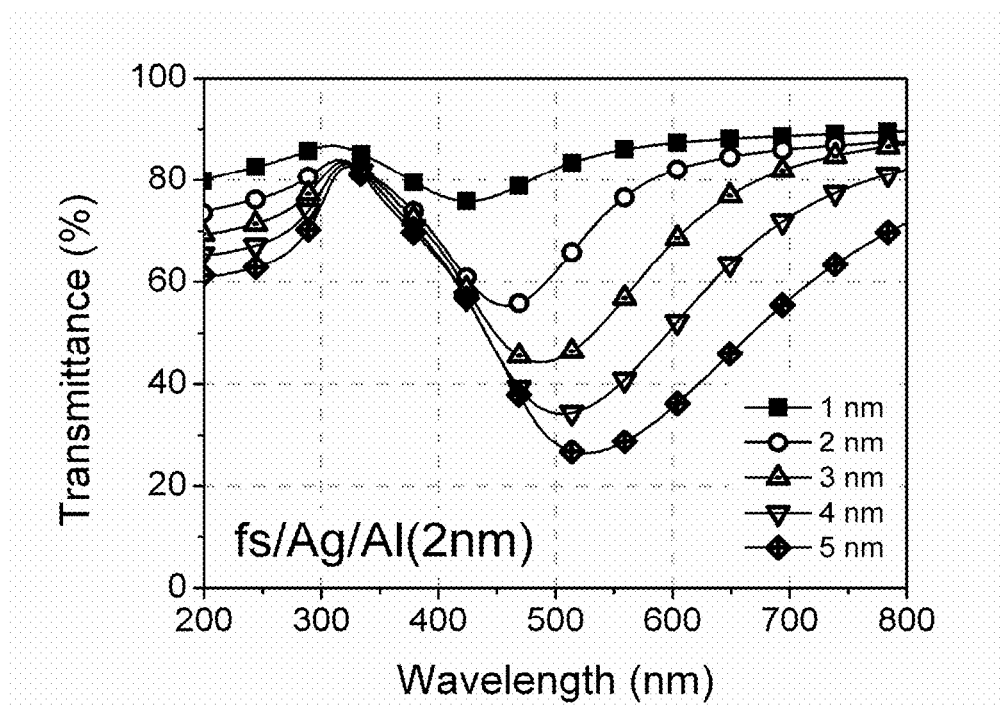
FIG. 9C shows embodiments of Ag+aluminum (Al) NPs coating on fused silica (fs) with various Ag deposition thicknesses.
Figure 9D:
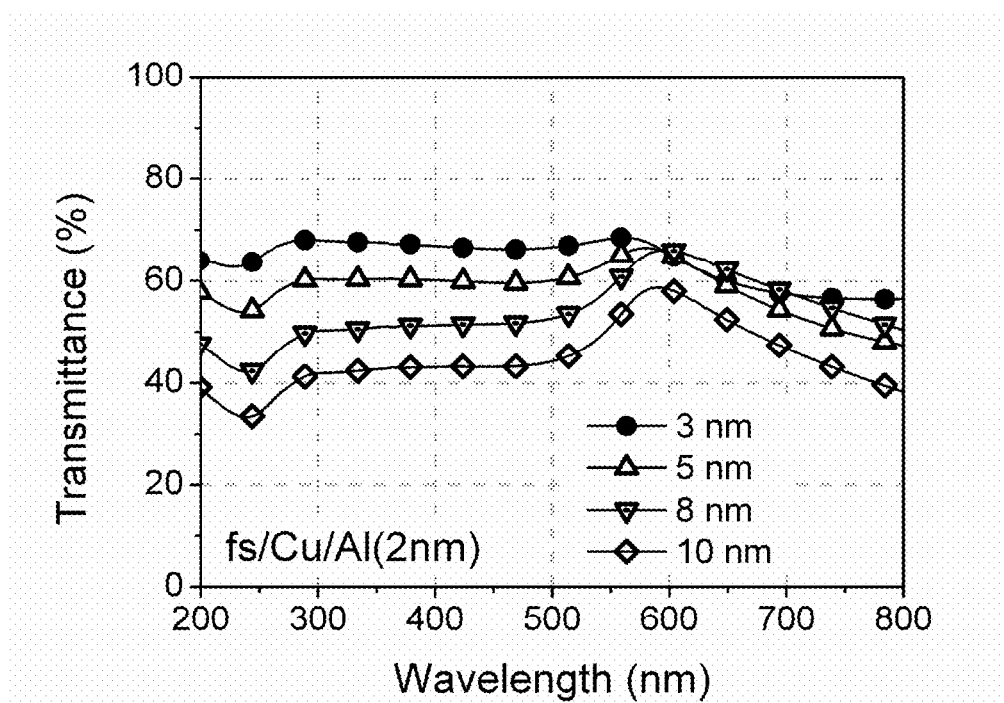
FIG. 9D shows embodiments of Cu+Al NPs coating on fused silica (fs) with varied Cu deposition thickness.

Effect of Primary Material (e.g., Metal with Screened Plasma Frequency at Near-Ultraviolet or Visible Region and Also Relatively Low Absorption Such as Silver):

In FIG. 9A and FIG. 9C, there is presented embodiments which various deposition thicknesses of Ag as the primary material (metal) represented by 1 nm, 2 nm, 3 nm, 4 nm and 5 nm are used. In FIG. 9B and FIG. 9D, various deposition thicknesses of Copper (Cu) as the primary material (metal) represented by 3 nm, 5 nm, 8 nm, 10 nm and 14 nm are used. In FIG. 9C and FIG. 9D, the deposition thickness of Aluminum (Al) as the second material (metal) is fixed at 2 nm in those embodiments. It should be noted that any of these thicknesses should be equal to or smaller than 15 nm. Comparing between Ag and Cu as the primary material, Ag resonance is shifted by altering deposition thickness and also by introducing the second material. For Cu, the resonance (about 600 nm) is barely shifted, and the overall transmission of the samples having Cu as the primary material is relatively lower than those having Ag as the primary material. Aluminum (Al) is also used as one of the nano metals in some of these embodiments and the substrate used is fused silica.

From the results of FIGS. 9A, 9B, 9C and 9D, it is provided that the primary material shall be metal with screened plasma frequency at near-ultraviolet region or visible spectral regions such that the resonance can be tuned in the visible region due to the red-shift phenomenon. Most importantly, the primary material shall have relatively low absorption in visible spectral region so that a relatively higher overall transmittance can be achieved (e.g. silver).

Single metal having screened plasma frequency at visible region (e.g. copper (Cu) or gold (Au)) may induce similar color effect like silver but they are intrinsically loss in the visible region (i.e. higher absorption of light), leading to a relatively lower overall transmittance.

Figure 10:
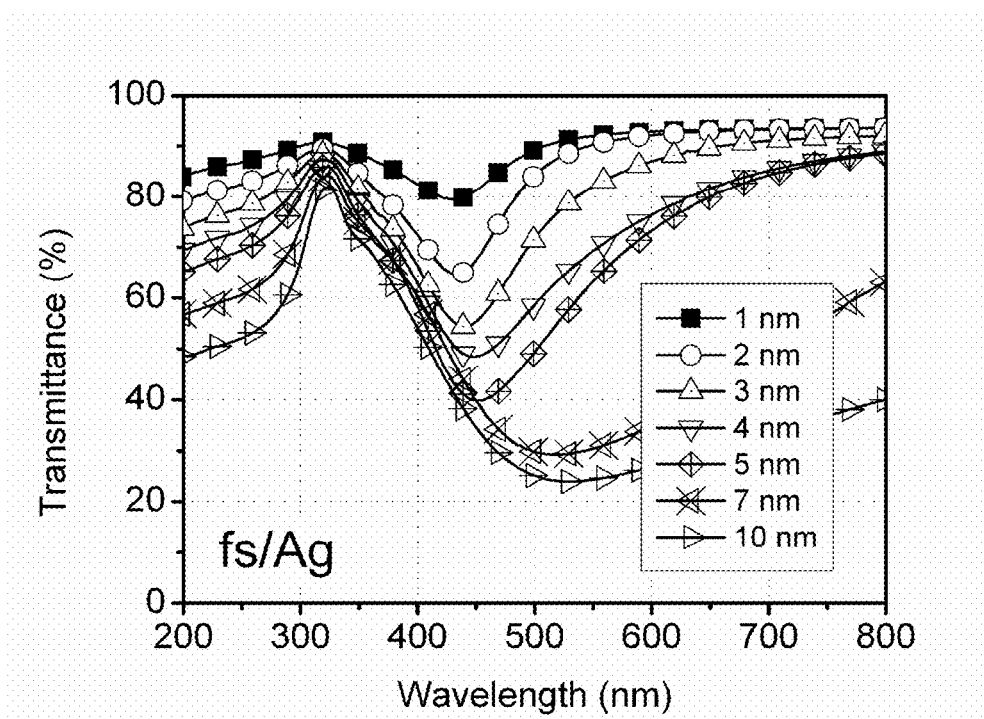
FIG. 10 shows embodiments of Ag coating with various deposition thicknesses on fused silica (fs).

Effect of Deposition Thickness of Primary Material:

As shown in FIG. 10, with an increasing deposition thickness, the transmission at visible region drops significantly, especially for wavelengths larger than 450 nm. Considering the optical transmission, the deposition thickness of Ag should be equal to or below 15 nm, which is the "critical thickness" for the present deposition process under the deposition parameters of the present invention.

Sufficiently thin metal layers are indeed small aggregates in certain embodiments of the present invention. Once the metal deposits on substrates reach the "critical thickness", the small aggregates begin to merge as indicated by a rapid decrease in electrical resistivity. Different metals have different "critical thickness", but the actual value depends on the choice of metal, the nature of substrate, substrate temperature and deposition rate. This is known in the art as reported in the section entitled "(b) Rate of Evaporation" under column 1 and column 2 of page 207 of the reference Sennett and G. D. Scott, "The Structure of Evaporated Metal Films and Their Optical Properties", Journal of the Optical Society of America, 40, 203 (1950). For Ag, the "critical thickness" is generally about 15 nm.

Figure 11A:
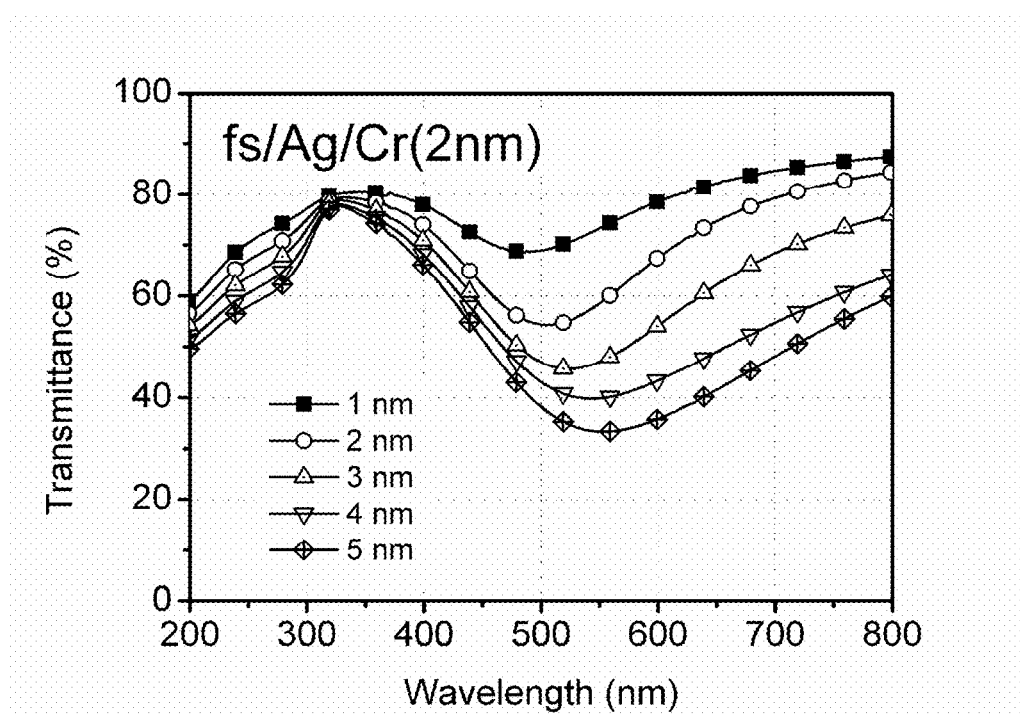
FIG. 11A shows embodiments of Ag NPs coating at various deposition thicknesses with a second metal, Cr coating, on fused silica (fs).
Figure 11B:
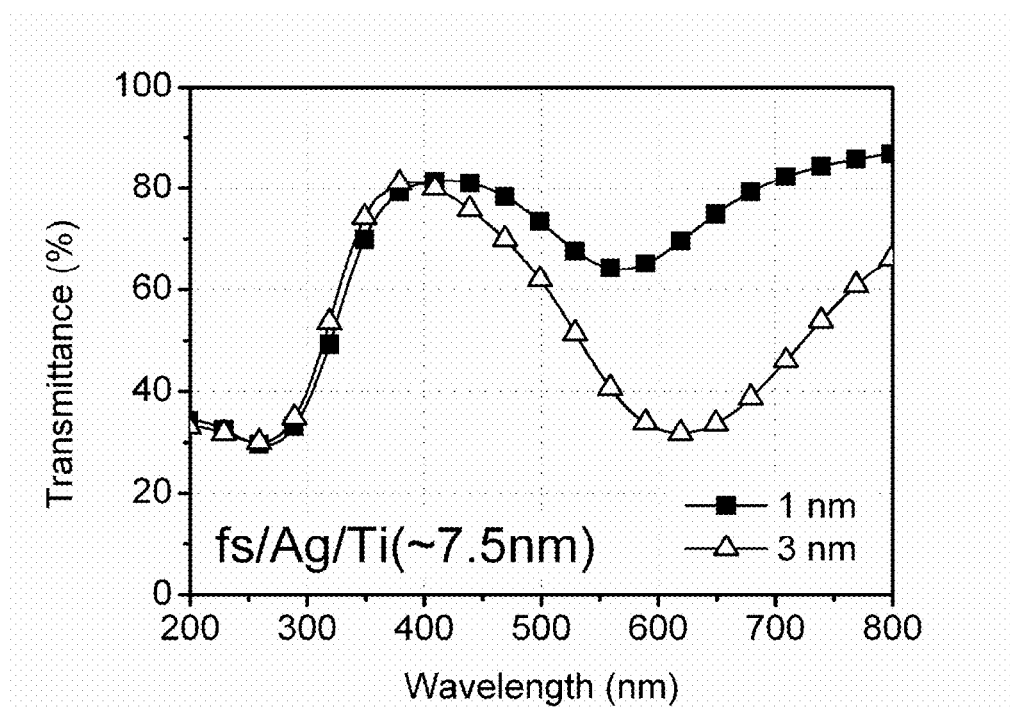
FIG. 11B shows embodiments of Ag NPs coating at various deposition thicknesses with a second metal, Ti coating, on fused silica (fs).
Figure 11C:
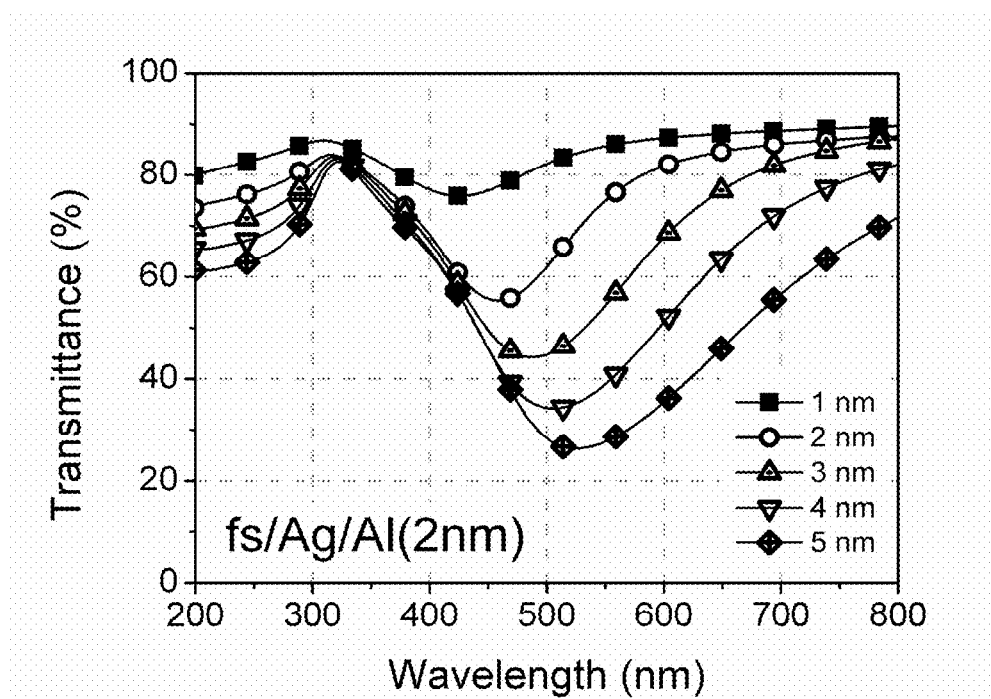
FIG. 11C shows embodiments of Ag NPs coating at various deposition thicknesses with a second metal, Al compound (e.g. oxide) coating, on fused silica (fs).
Figure 11D:
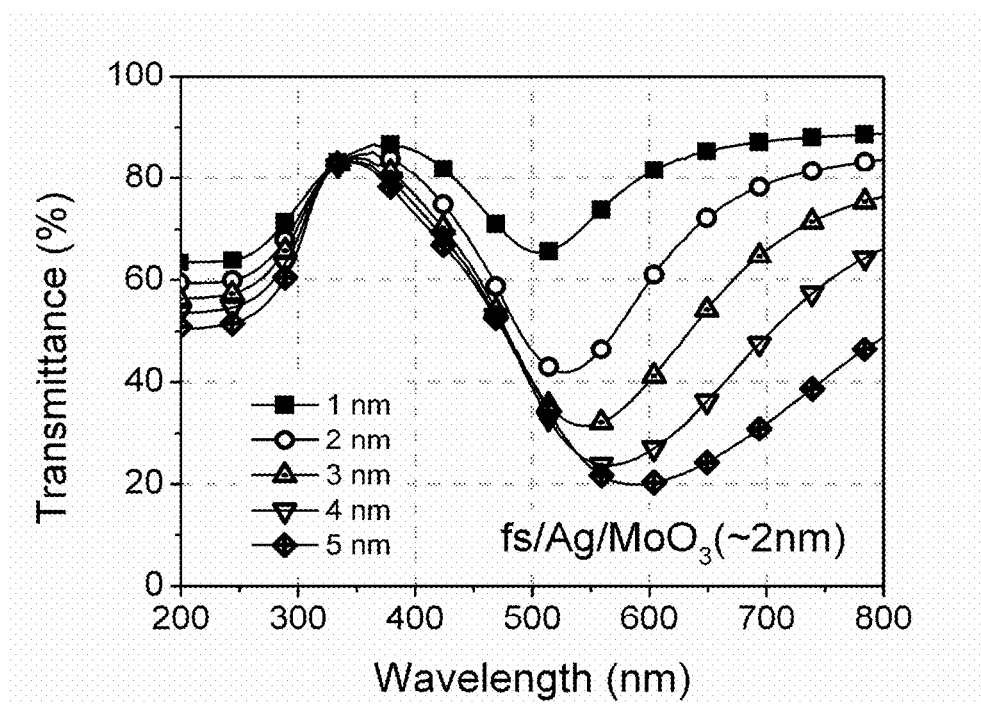
FIG. 11D shows embodiments of Ag NPs coating at various deposition thicknesses with a second metal oxide, molybdenum trioxide ($MoO_3$) coating, on fused silica (fs).
Figure 11E:
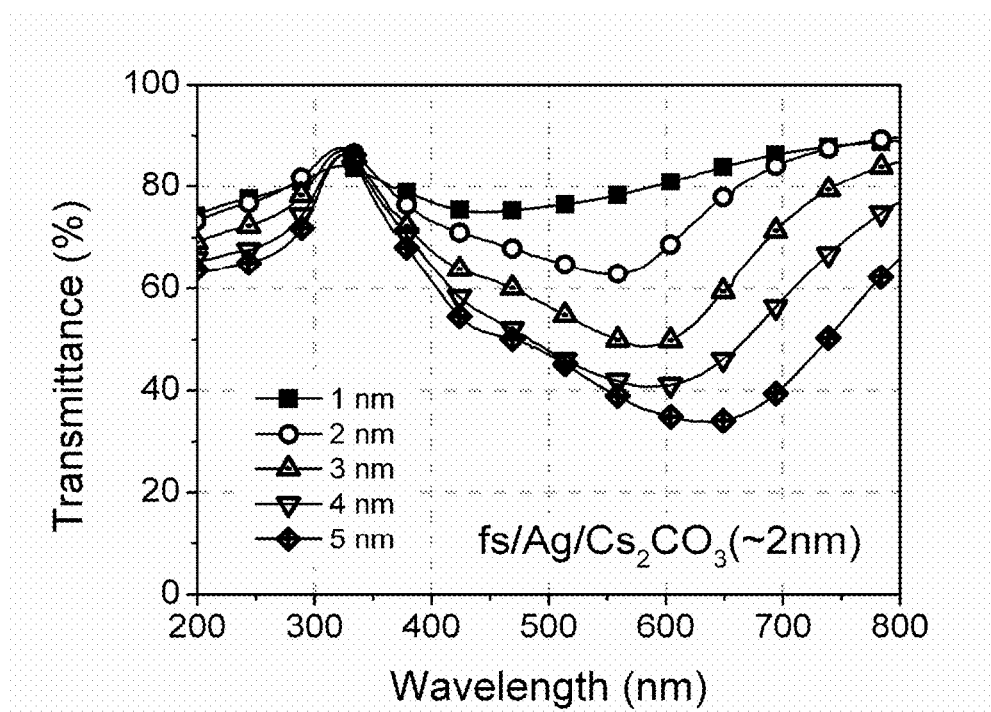
FIG. 11E shows embodiments of Ag NPs coating at various deposition thicknesses with a second metal carbonate, cesium carbonate ($Cs_2CO_3$) coating, on fused silica (fs).
Figure 11F:
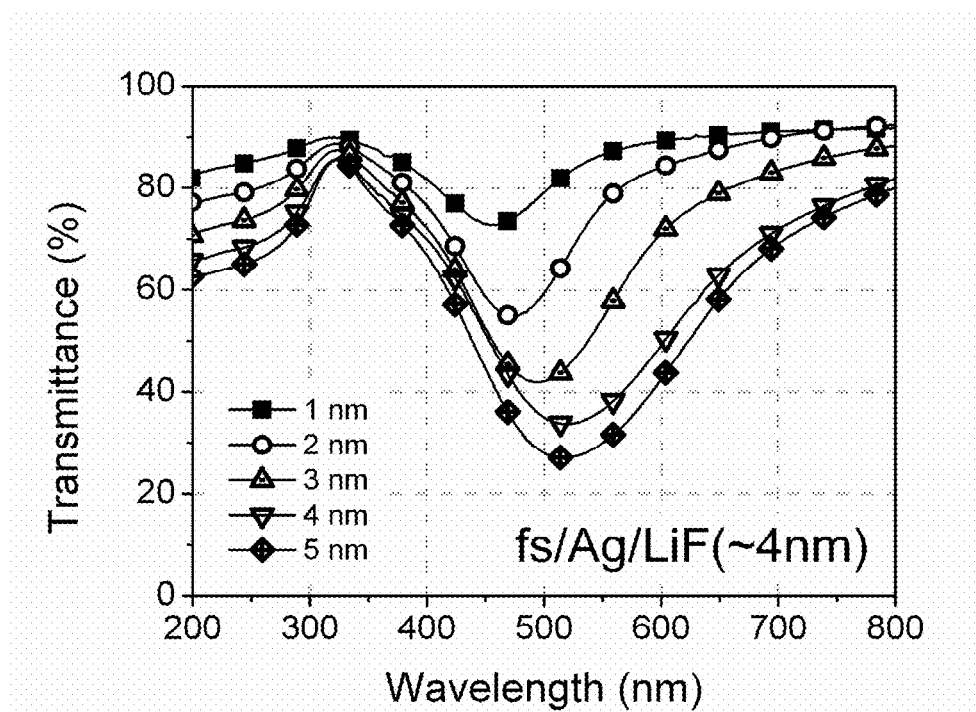
FIG. 11F shows embodiments of Ag NPs coating at various deposition thicknesses with a second inorganic material, lithium fluoride (LiF) coating, on fused silica (fs).

Effect of Second Material (e.g., Pure Metal, Metal Oxide, Metal Carbonate, Inorganic Compound):

In FIG. 11A, FIG. 11B, FIG. 11C, FIG. 11D, FIG. 11E and FIG. 11F, there is presented embodiments which various deposition thicknesses of Ag represented by 1 nm, 2 nm, 3 nm, 4 nm and 5 nm are used whilst the deposition thickness of different second materials represented by a value in a bracket is constant, e.g., the deposition thickness of Ti is ~7.5 nm in FIG. 11B, and where any of these deposition thicknesses of Ag and the second material shall be equal to or smaller than 15 nm. All the figures show that Ag resonance is red-shifted after adding a second material. In these embodiments, the second material is added by evaporation.

Figure 12:
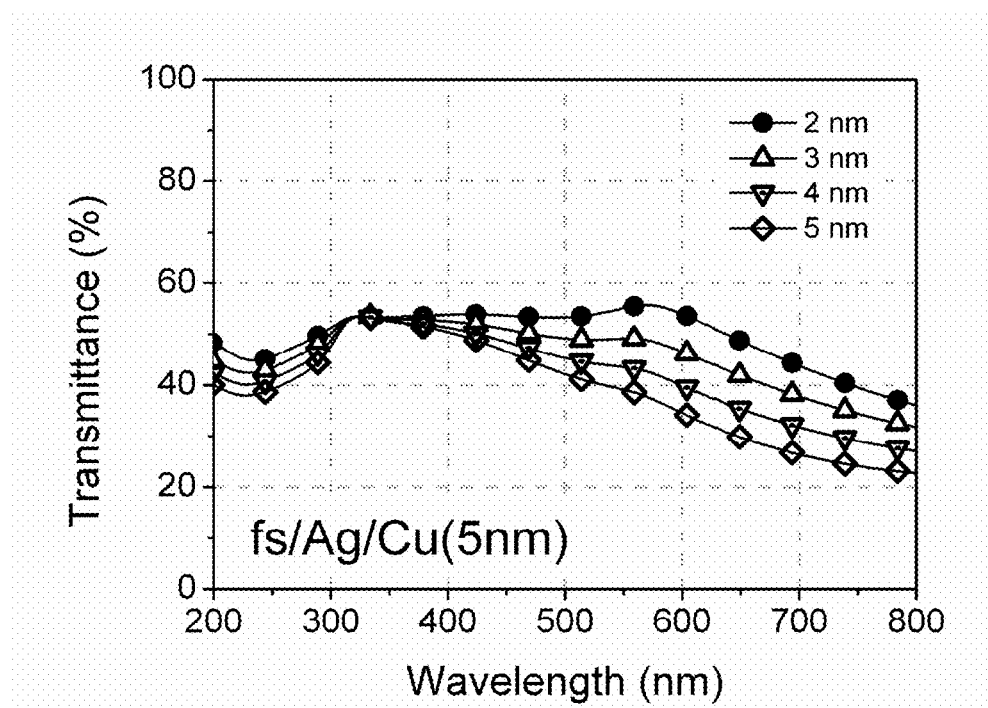
FIG. 12 shows embodiments of Ag+Cu NPs coating with various Ag deposition thicknesses on fused silica (fs).

In FIG. 12, there is presented embodiments which various deposition thicknesses of Ag represented by 2 nm, 3 nm, 4 nm and 5 nm are used whilst the deposition thickness of the second material, Cu, represented by a value in a bracket, i.e., 5 nm, is constant. It should be noted that any of these deposition thicknesses of Ag and the second material shall be equal to or smaller than 15 nm. From the result of FIG. 12, Cu is shown not to be a desirable second material because of its relatively high absorption in visible spectral region, discouraging Ag resonance and suppressing the overall transmission, which leads to dull color appearance.

By introducing a second material, Ag resonance is red-shifted in general leading to a change of perceived color. This second material acts as a color modifier. It can be metal, metal oxide, metal carbonate, or inorganic compound, provided that its absorption is relatively low in the visible spectral region. For example, Cu and Au are not desirable candidates as the second material because of relatively high absorption in visible spectral region.

The deposition method of second material can be the same as the primary material if source material is available in the form for such deposition. If the deposition method is by sputtering, the source materials will mostly be limited to metals and oxides, whilst lots of source materials in powder or pellet form can be used in evaporation including carbonates and inorganic compounds. Therefore, in most of the embodiments of the present invention, evaporation is used for deposition of both primary and second materials.

There is no deposition thickness limit for metal oxides, metal carbonates and inorganic compound as second material, provided that they are optically transparent. However, the deposition thickness of metal as second material shall follow the primary material for the same reason, that is, equal to or below 15 nm, this being the "critical thickness" of said metal that is used as the second material, in order to avoid loss of transmission in visible spectral region.

About Ag Critical Thickness:

From the reference of R. S. Sennett and G. D. Scott, "The Structure of Evaporated Metal Films and Their Optical Properties", Journal of the Optical Society of America, 40, 203 (1950), it is noted that "The absorptions have a maximum for all wavelengths at thickness somewhat less than 100 Å. As can be seen from the micrographs this is just below the 'critical' thickness—that for which the aggregates begin to merge and for which, as is well known, a rapid decrease in the electrical resistivity of the film occurs." From the results in FIG. 2a. as shown in R. S. Sennett and G. D. Scott, "The Structure of Evaporated Metal Films and Their Optical Properties", Journal of the Optical Society of America, 40, 203 (1950), the "critical thickness" of Ag=100 Å=10 nm (just before Ag aggregates begin to merge together) for the experiments in that prior art.

But, it is also stated in R. S. Sennett and G. D. Scott, "The Structure of Evaporated Metal Films and Their Optical Properties", Journal of the Optical Society of America, 40, 203 (1950) that "It is clear that the 'slow' films are generally more aggregated for thickness over 100 Å. A comparison of the structure and thickness of slow films of FIG. 3a with the fast films of FIG. 2a (both Figures as referenced to the respective figures in R. S. Sennett and G D. Scott, "The Structure of Evaporated Metal Films and Their Optical Properties", Journal of the Optical Society of America, 40, 203 (1950)) shows that the aggregates of slowly formed films tend to grow more in height, i.e., become thicker before joining together than do the aggregates of rapidly formed films which tend to remain thin and grow out over the substrate. For example the 175 Å 20-min. film exhibits well-separated aggregates whereas the 180 Å 2-sec. film is almost continuous". Hence, in fact, the critical thickness can be changed. One of the factors is deposition rate. With a slower deposition rate, the critical thickness can be increased. Here, in FIG. 3a in R. S. Sennett and G. D. Scott, "The Structure of Evaporated Metal Films and Their Optical Properties", Journal of the Optical Society of America, 40, 203 (1950), the "critical thickness" is ~30 nm.

Figure 13:
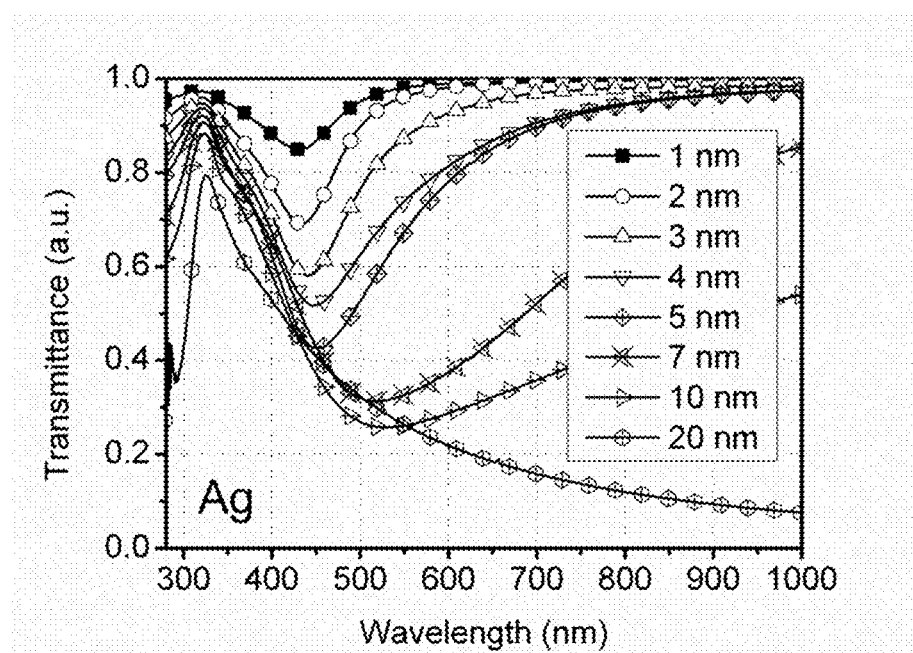
FIG. 13 shows transmission of Ag NPs coating with various Ag coating thicknesses without the effect of substrates.

FIG. 13 is the results from the Ag NPs coating in various thicknesses prepared by the process of the present invention. It shows that there is no color effect for the Ag NPs coating with 20 nm thickness since the resonance dip is decreased, particularly in wavelength range 500-1000 nm.

Figure 14:
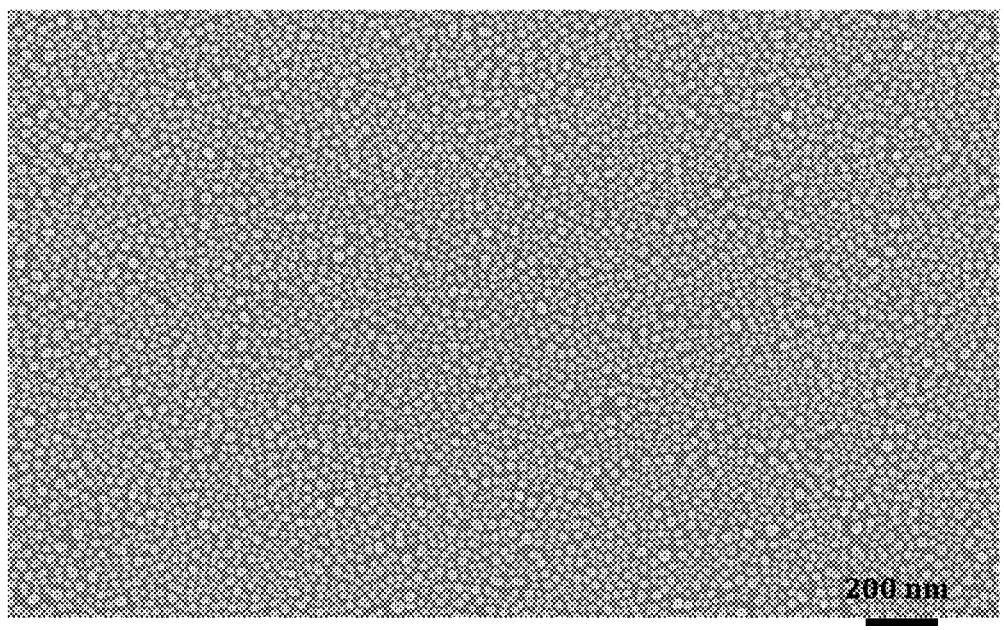
FIG. 14 shows the SEM picture of Ag NPs deposited at a coating thickness of ≤15 nm.
Figure 15:
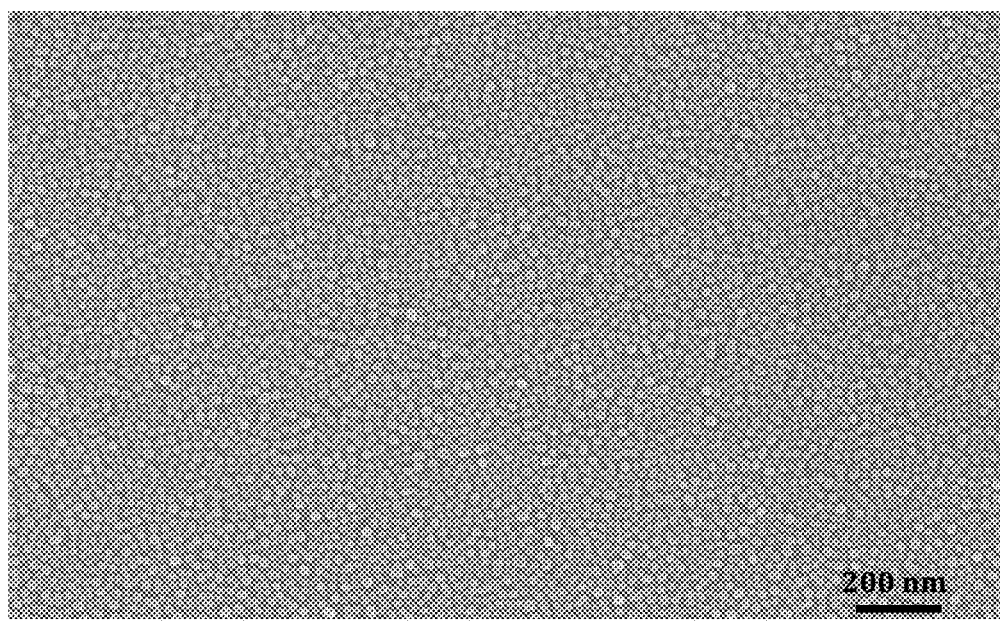
FIG. 15 shows the SEM picture of Ag+Cr NPs deposited at a coating thickness of ≤15 nm.

FIG. 14 shows the SEM picture of Ag NPs deposited at a coating thickness of ≤15 nm. FIG. 15 shows the SEM picture of Ag+Cr NPs deposited at a coating thickness of ≤15 nm. From both FIG. 14 and FIG. 15, it can be seen that at deposit thickness of less than or equal to the "critical thickness", which is 15 nm, and that the materials are still in particle form.

Remark: Silver as a Second Material

Figure 16:
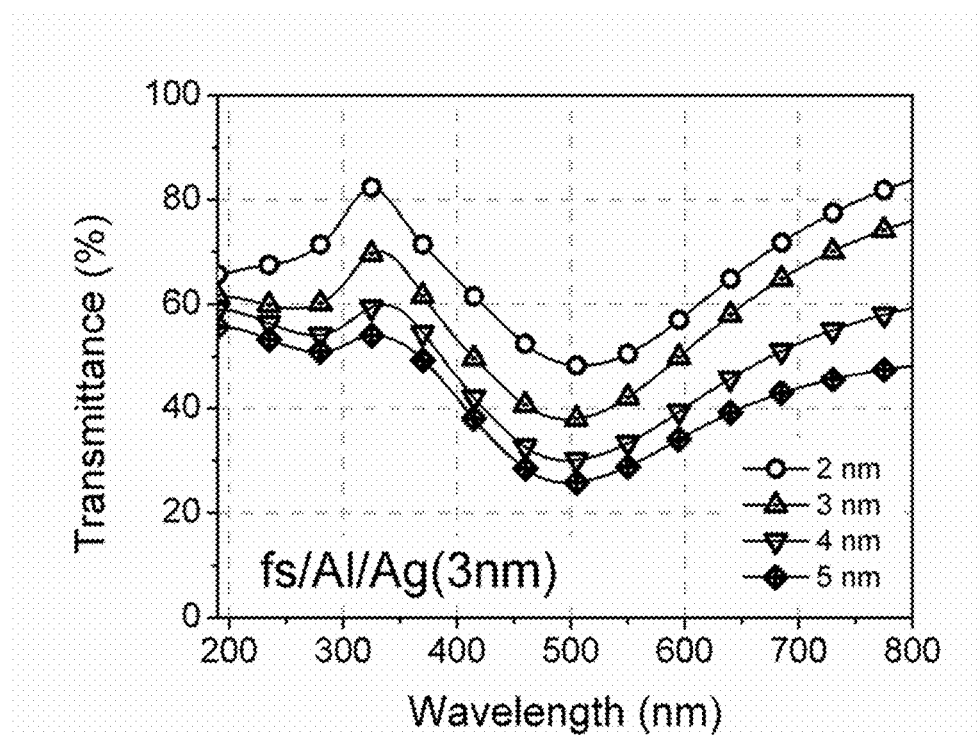
FIG. 16 shows embodiments of Al+Ag NPs coating with various Al deposition thicknesses on fused silica (fs).

In FIG. 16, there is presented embodiments which various deposition thicknesses of Al represented by 2 nm, 3 nm, 4 nm and 5 nm are used as the primary material whilst the deposition thickness of Ag represented by a value in a bracket, i.e., 3 nm, is constant, where any of these thicknesses shall be equal to or below 15 nm. The resonance wavelength does not vary with an increasing Al deposition thickness, but there is a decrease in overall transmittance. For the primary material (metal) with screened plasma frequency at deep-ultraviolet region (e.g. aluminum), the change of its color depends very much on whether the second material has a screened plasma frequency at near-ultraviolet or visible region (e.g. silver). This is similar to the case of using single metal for achieving the color effect (see FIG. 9A), except that the substrate is modified in that example/embodiment. On the contrary, for example, in FIG. 16, the substrate is simply pre-coated with aluminum.

In one embodiment of the present invention, the nano bi-material nanoparticles (NPs) deposited on a substrate can act as a filter for different electromagnetic radiations.

In a further embodiment of the present invention, the nano bi-material nanoparticles (NPs) deposited on a substrate can act as a reflector for different electromagnetic radiations.

Although in some of the embodiments illustrated as examples, the first and second materials are deposited onto a substrate at various thicknesses or at a fixed thickness, it should be understood that the two dissimilar nano particles composed of the first and second materials form at least one layer of two dissimilar nano particles on said substrate and is optionally covered by a protective layer in the present invention, provided that said at least one layer of two dissimilar nano particles has a "critical thickness" as defined in the present invention or has a thickness equals to or less than 15 nm. The two dissimilar nano particles composed of the first and second materials should also be brought in close proximity with a distance of 1-15 nm apart from each other (with relative position of each pair of dissimilar nano particles in random three-dimensional direction in respect with the other pairs of dissimilar nano particles such that the two materials are not arranged as stacked on top of each other) in said at least one layer of two dissimilar nano particles such that the first material can be red shifted by the second material. The only exception to the limitation to the thickness of the at least one layer of two dissimilar nano particles composed of the first and second materials is that when the second material is optically transparent. In this case, the thickness of the at least one layer of two dissimilar nano particles can then be more than the "critical thickness" (e.g., more than 15 nm). The first material is preferably a metal, e.g. Ag or Al, while the second material can be a metal-based material or inorganic compounds, such as chromium, aluminum, titanium, $MoO_3$, $Cs_2CO_3$ and LiF. An average particle size of the two dissimilar nano particles ranges from 10 to 60 nm in circular disc diameter. The substrate which the at least one layer of two dissimilar nano particles is deposited thereon is a transparent or translucent substrate with a smooth and unmarked or non-textured surface. The substrate can be glass, quartz, fused silica, and sapphire. The protective layer being optionally deposited onto the at least one layer of two dissimilar nano particles can be alumina and poly(methyl methacrylate). The deposition of the nano particles composed of the first material onto the substrate can be carried out by a first PVD method, e.g., by evaporation or sputtering; the deposition of another nano particles composed of the second material onto the substrate can be carried out by a second PVD method, e.g., by resistive thermal evaporation, electron beam evaporation, sputtering and/or ion plating. The deposition of the optional protecting layer onto the at least one layer of two dissimilar nano particles can be carried out by a further PVD method or solution process, e.g., by evaporation or by spin coating.

INDUSTRIAL APPLICATIONS

The present invention relates to a nano bi-material, electromagnetic spectrum shifters including color filters and reflectors based on said nano bi-material and method to produce such electromagnetic spectrum shifter using said nano bi-material. Said nano bi-material comprises a primary material and a second material, wherein at least one of said materials is metal based. In particular, the present invention provides nano bi-material based color filters with a wide range of transmission and color tunability and methods to produce such color filters. The present invention has applications in color filtration, production of color filters, reflector, production of reflectors, electromagnetic spectrum shifter, and production of electromagnetic spectrum shifters.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

We claim:

1. A tunable electromagnetic spectrum shifter comprising: at least two different nano particles deposited as at least one layer onto at least one surface of one or more transparent, translucent, or reflective substrates; wherein the at least two different nano particles are plasmonically coupled and electromagnetic spectrum shifting is achieved via plasmonic coupling between the at least two different nano particles in the at least one layer of at least two different nano particles; wherein the at least two different nano particles are within 1-15 nm of each other on the at least one surface of an one or more transparent, translucent, or reflective substrate; and wherein relative positions of the at least two different nano particles in each pair of the at least two different nano particles are in random three-dimensional direction in respect with other pairs such that the at least two different nano particles in each of said at least one layer of at least two different nano particles are not arranged as one layer of one nano particles stacked on top of another layer of the other one nano particles.

2. The tunable electromagnetic spectrum shifter according to claim 1, further comprising at least one transparent protective layer further deposited to protect said at least one layer of at least two different deposited nano particles.

3. The tunable electromagnetic spectrum shifter according to claim 1 wherein thickness of any one of said at least one layer of at least two different nano particles is at least 1 nm and no more than 15 nm.

4. The tunable electromagnetic spectrum shifter according to claim 1 wherein average nano particle size of any one of said at least two different nano particles is in a range of 10 nm to 60 nm in circular disc diameter.

5. The tunable electromagnetic spectrum shifter according to claim 1 wherein the distance between the at least two different nano particles is at least 1 nm.

6. The tunable electromagnetic spectrum shifter according to claim 1 wherein the at least two different nano particles comprise one nano metal particles and at least one other different nano particles being sequentially deposited onto said at least one surface of the one or more transparent, translucent, or reflective substrate to form said at least one layer of the at least two different nano particles.

7. The tunable electromagnetic spectrum shifter according to claim 6 wherein the one nano metal particles is composed of metals which are screened plasma frequency at near-ultraviolet region or visible spectral regions such that the resonance is tunable in the visible spectral region due to the red-shift phenomenon in the presence of said at least one other different nano particles which are within 1-15 nm of the one nano metal particles, and have a relatively lower absorption in visible spectral region such that a relatively higher overall transmittance is resulted in said shifter.

8. The tunable electromagnetic spectrum shifter according to claim 6 wherein the at least one other different nano particles is composed of materials comprising metal, metal oxide, metal carbonate, or inorganic compounds.

9. The tunable electromagnetic spectrum shifter according to claim 8 wherein when said metal oxide, metal carbonate and inorganic compounds are optically transparent the deposition thickness of the at least one other different nano particles is more than 15 nm.

10. The tunable electromagnetic spectrum shifter according to claim 6 wherein the at least one other different nano particles acts as a color modifier in said shifter.

11. The tunable electromagnetic spectrum shifter according to claim 1 wherein transmission or color of said shifter is tunable by varying materials for any one or more of the at least two different nano particles and/or by varying the deposition thickness of any one or more of the at least two different nano particles.

12. The tunable electromagnetic spectrum shifter according to claim 1 wherein said transparent or translucent substrate comprises glass, quartz, fused silica, and sapphire, and wherein said substrate has a smooth and unmarked or non-textured surface.

13. The tunable electromagnetic spectrum shifter according to claim 1 wherein one of said at least two different nano particles is metal based while the other of said at least two different nano particles is either metal based or an inorganic compound.

14. The tunable electromagnetic spectrum shifter according to claim 1 wherein said one of the at least two different nano particles is silver or aluminum nano particles while said the other of the at least two different nano particles comprises nano particles of chromium, aluminum, titanium, MoO3, Cs2CO3 and LiF.

15. The tunable electromagnetic spectrum shifter according to claim 2 wherein said transparent protective layer comprises alumina and poly(methyl methacrylate).

16. The tunable electromagnetic spectrum shifter according to claim 1 wherein said electromagnetic spectrum shifter comprises a tunable color filtration apparatus and a reflector.

17. A process of making the tunable electromagnetic spectrum shifter according to claim 1 comprising: depositing a first nano particles onto at least one surface of an one or more transparent, translucent, or reflective substrate via a first physical vapor deposition method;
depositing at least one further nano particles which is different to the first nano particles onto said substrate or the first nano particles via the first physical vapor deposition method or a second physical vapor deposition method in order to form at least one layer of two different nano particles;
depositing at least one transparent protective layer onto the surface of said at least one layer of two different nano particles via any one of the first and second physical vapor deposition methods physical vapor deposition method or a solution process or an adhesive process.

18. The process according to claim 17, wherein the first physical deposition method and the second physical deposition method comprising resistive thermal evaporation, electron beam evaporation, sputtering and ion plating; wherein the solution process is a spin coating process; and wherein the adhesive process is a physical process of attaching a transparent adhesive film.

19. A tunable electromagnetic spectrum filter comprising: at least two different nano particles deposited as at least one layer onto at least one surface of an one or more transparent or translucent substrates; wherein the at least two different nano particles are plasmonically coupled and electromagnetic spectrum filtering is achieved via plasmonic coupling between the at least two different nano particles in the at least one layer of at least two different nano particles; wherein the at least two different nano particles are within 1-15 nm of each other on the at least one surface of an one or more transparent or translucent substrate; and wherein relative positions of the at least two different nano particles in each pair of the at least two different nano particles are in random three-dimensional direction in respect with other pairs such that the at least two different nano particles in each of said at least one layer of at least two different nano particles are not arranged as one layer of one nano particles stacked on top of another layer of the other one nano particles.

20. A tunable electromagnetic spectrum reflector comprising: at least two different nano particles deposited as at least one layer onto at least one surface of an one or more reflective substrates; wherein the at least two different nano particles are plasmonically coupled and electromagnetic spectrum filtering is achieved via plasmonic coupling between the at least two different nano particles in the at least one layer of at least two different nano particles; wherein the at least two different nano particles are within 1-15 nm of each other on the at least one surface of an one or more reflective substrate; and wherein relative positions of the at least two nano particles in each pair of the at least two different nano particles are in random three-dimensional direction in respect with other pairs such that the at least two different nano particles in each of said at least one layer of at least two different nano particles are not arranged as one layer of one nano particles stacked on top of another layer of the other one nano particles.

* * * * *